US008916845B2

(12) United States Patent
Chen et al.

(10) Patent No.: US 8,916,845 B2
(45) Date of Patent: Dec. 23, 2014

(54) LOW OPERATIONAL CURRENT PHASE CHANGE MEMORY STRUCTURES

(75) Inventors: Shih-Hung Chen, Hsinchu County (TW); Yi-Chou Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 106 days.

(21) Appl. No.: 13/324,946

(22) Filed: Dec. 13, 2011

(65) Prior Publication Data

US 2012/0080657 A1 Apr. 5, 2012

Related U.S. Application Data

(62) Division of application No. 12/433,573, filed on Apr. 30, 2009, now Pat. No. 8,097,871.

(51) Int. Cl.
*H01L 47/00* (2006.01)
*H01L 45/00* (2006.01)
*H01L 27/24* (2006.01)

(52) U.S. Cl.
CPC .......... *H01L 45/122* (2013.01); *H01L 27/2436* (2013.01); *H01L 45/1226* (2013.01); *H01L 45/1233* (2013.01); *H01L 45/1293* (2013.01); *H01L 45/06* (2013.01); *H01L 45/1675* (2013.01); *H01L 45/144* (2013.01); *H01L 45/1641* (2013.01); *H01L 45/12* (2013.01); *H01L 45/1616* (2013.01); *Y10S 977/943* (2013.01)
USPC ............................................. 257/2; 977/943

(58) Field of Classification Search
CPC ... H01L 45/06; H01L 45/1293; H01L 45/122; H01L 45/12; H01L 45/1253; H01L 45/128; H01L 45/00
USPC .................................... 257/2, 5, 42, E47.001
See application file for complete search history.

(56) References Cited

U.S. PATENT DOCUMENTS

| 3,271,591 | A | 9/1966 | Ovshinsky |
| 3,530,441 | A | 9/1970 | Ovshinsky |
| 4,452,592 | A | 6/1984 | Tsai |
| 4,599,705 | A | 7/1986 | Holmberg et al. |
| 4,719,594 | A | 1/1988 | Young et al. |
| 4,769,339 | A | 9/1988 | Ishii |
| 4,876,220 | A | 10/1989 | Mohsen et al. |
| 4,959,812 | A | 9/1990 | Momodomi et al. |
| 5,106,775 | A | 4/1992 | Kaga et al. |
| 5,166,096 | A | 11/1992 | Cote et al. |
| 5,166,758 | A | 11/1992 | Ovshinsky et al. |
| 5,177,567 | A | 1/1993 | Klersy et al. |
| 5,332,923 | A | 7/1994 | Takeuchi |

(Continued)

OTHER PUBLICATIONS

"Magnetic Bit Boost," www.sciencenews.org, Dec. 18 & 25, 2004, p. 389, vol. 166.

(Continued)

*Primary Examiner* — Whitney T Moore
(74) *Attorney, Agent, or Firm* — Yiding Wu; Haynes Beffel & Wolfeld LLP

(57) ABSTRACT

Memory cells described herein have an increased current density at lateral edges of the active region compared to that of conventional mushroom-type memory cells, resulting in improved operational current efficiency. As a result, the amount of heat generated within the lateral edges per unit value of current is increased relative to that of conventional mushroom-type memory cells. Therefore, the amount of current needed to induce phase change is reduced.

13 Claims, 18 Drawing Sheets

(56) References Cited

U.S. PATENT DOCUMENTS

| | | | |
|---|---|---|---|
| 5,391,901 A | 2/1995 | Tanabe |
| 5,515,488 A | 5/1996 | Hoppe et al. |
| 5,534,712 A | 7/1996 | Ovshinsky et al. |
| 5,550,396 A | 8/1996 | Tsutsumi |
| 5,687,112 A | 11/1997 | Ovshinsky |
| 5,688,713 A | 11/1997 | Linliu et al. |
| 5,716,883 A | 2/1998 | Tseng |
| 5,754,472 A | 5/1998 | Sim |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,902,704 A | 5/1999 | Schoenborn et al. |
| 5,920,788 A | 7/1999 | Reinberg |
| 5,933,365 A | 8/1999 | Klersy et al. |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan |
| 6,025,220 A | 2/2000 | Sandhu |
| 6,031,287 A | 2/2000 | Harshfield |
| 6,034,882 A | 3/2000 | Johnson et al. |
| 6,046,951 A | 4/2000 | El Hajji |
| 6,066,870 A | 5/2000 | Siek |
| 6,075,719 A | 6/2000 | Lowrey et al. |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,291,137 B1 | 9/2001 | Lyons et al. |
| 6,314,014 B1 | 11/2001 | Lowrey et al. |
| 6,316,348 B1 | 11/2001 | Fu et al. |
| 6,320,786 B1 | 11/2001 | Chang et al. |
| 6,326,307 B1 | 12/2001 | Lindley et al. |
| 6,337,266 B1 | 1/2002 | Zahorik |
| 6,339,544 B1 | 1/2002 | Chiang et al. |
| 6,351,406 B1 | 2/2002 | Johnson et al. |
| 6,372,651 B1 | 4/2002 | Yang et al. |
| 6,380,068 B2 | 4/2002 | Jeng et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,440,837 B1 | 8/2002 | Harshfield |
| 6,462,353 B1 | 10/2002 | Gilgen |
| 6,483,736 B2 | 11/2002 | Johnson et al. |
| 6,487,106 B1 | 11/2002 | Kozicki |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,512,263 B1 | 1/2003 | Yuan et al. |
| 6,514,788 B2 | 2/2003 | Quinn |
| 6,514,820 B2 | 2/2003 | Ahn et al. |
| 6,534,781 B2 | 3/2003 | Dennison |
| 6,545,903 B1 | 4/2003 | Wu |
| 6,551,866 B1 | 4/2003 | Maeda |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,576,546 B2 | 6/2003 | Gilbert et al. |
| 6,579,760 B1 | 6/2003 | Lung |
| 6,586,761 B2 | 7/2003 | Lowrey |
| 6,589,714 B2 | 7/2003 | Maimon et al. |
| 6,593,176 B2 | 7/2003 | Dennison |
| 6,596,589 B2 | 7/2003 | Tseng |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,674,115 B2 | 1/2004 | Hudgens et al. |
| 6,744,088 B1 | 6/2004 | Dennison |
| 6,750,079 B2 | 6/2004 | Lowrey et al. |
| 6,750,101 B2 | 6/2004 | Lung |
| 6,791,102 B2 | 9/2004 | Johnson et al. |
| 6,797,979 B2 | 9/2004 | Chiang et al. |
| 6,800,504 B2 | 10/2004 | Li et al. |
| 6,800,563 B2 | 10/2004 | Xu |
| 6,815,704 B1 | 11/2004 | Chen |
| 6,838,692 B1 | 1/2005 | Lung |
| 6,850,432 B2 | 2/2005 | Lu et al. |
| 6,859,389 B2 | 2/2005 | Idehara |
| 6,861,267 B2 | 3/2005 | Xu et al. |
| 6,864,500 B2 | 3/2005 | Gilton |
| 6,864,503 B2 | 3/2005 | Lung |
| 6,867,638 B2 | 3/2005 | Saiki et al. |
| 6,881,603 B2 | 4/2005 | Lai |
| 6,888,750 B2 | 5/2005 | Walker et al. |
| 6,894,304 B2 | 5/2005 | Moore |
| 6,894,305 B2 | 5/2005 | Yi et al. |
| 6,900,517 B2 | 5/2005 | Tanaka et al. |
| 6,903,362 B2 | 6/2005 | Wyeth et al. |
| 6,909,107 B2 | 6/2005 | Rodgers et al. |
| 6,910,907 B2 | 6/2005 | Layadi et al. |
| 6,927,410 B2 | 8/2005 | Chen |
| 6,928,022 B2 | 8/2005 | Cho et al. |
| 6,933,516 B2 | 8/2005 | Xu |
| 6,936,544 B2 | 8/2005 | Huang et al. |
| 6,936,840 B2 | 8/2005 | Sun et al. |
| 6,937,507 B2 | 8/2005 | Chen |
| 6,943,365 B2 | 9/2005 | Lowrey et al. |
| 6,969,866 B1 | 11/2005 | Lowrey et al. |
| 6,972,428 B2 | 12/2005 | Maimon |
| 6,972,430 B2 | 12/2005 | Casagrande et al. |
| 6,977,181 B1 | 12/2005 | Raberg |
| 6,992,932 B2 | 1/2006 | Cohen |
| 7,023,009 B2 | 4/2006 | Kostylev et al. |
| 7,033,856 B2 | 4/2006 | Lung |
| 7,038,230 B2 | 5/2006 | Chen et al. |
| 7,038,938 B2 | 5/2006 | Kang |
| 7,042,001 B2 | 5/2006 | Kim et al. |
| 7,054,183 B2 | 5/2006 | Rinerson et al. |
| 7,067,837 B2 | 6/2006 | Hwang et al. |
| 7,067,864 B2 | 6/2006 | Nishida et al. |
| 7,067,865 B2 | 6/2006 | Lung |
| 7,078,273 B2 | 7/2006 | Matsuoka et al. |
| 7,099,180 B1 | 8/2006 | Dodge et al. |
| 7,115,927 B2 | 10/2006 | Hideki et al. |
| 7,122,281 B2 | 10/2006 | Pierrat |
| 7,122,824 B2 | 10/2006 | Khouri et al. |
| 7,126,149 B2 | 10/2006 | Iwasaki et al. |
| 7,126,847 B2 | 10/2006 | Ha et al. |
| 7,132,675 B2 | 11/2006 | Gilton |
| 7,151,273 B2 | 12/2006 | Campbell et al. |
| 7,154,774 B2 | 12/2006 | Bedeschi et al. |
| 7,158,411 B2 | 1/2007 | Yeh et al. |

(56) References Cited

U.S. PATENT DOCUMENTS

| | | |
|---|---|---|
| 7,164,147 B2 | 1/2007 | Lee et al. |
| 7,166,533 B2 | 1/2007 | Happ |
| 7,169,635 B2 | 1/2007 | Kozicki |
| 7,202,493 B2 | 4/2007 | Lung |
| 7,208,751 B2 | 4/2007 | Ooishi |
| 7,214,958 B2 | 5/2007 | Happ |
| 7,220,983 B2 | 5/2007 | Lung |
| 7,229,883 B2 | 6/2007 | Wang et al. |
| 7,238,959 B2 | 7/2007 | Chen |
| 7,238,994 B2 | 7/2007 | Chen et al. |
| 7,248,494 B2 | 7/2007 | Oh et al. |
| 7,251,157 B2 | 7/2007 | Osada et al. |
| 7,253,429 B2 | 8/2007 | Klersy et al. |
| 7,254,059 B2 | 8/2007 | Li et al. |
| 7,269,052 B2 | 9/2007 | Segal et al. |
| 7,277,317 B2 | 10/2007 | Le Phan |
| 7,291,556 B2 | 11/2007 | Choi et al. |
| 7,309,630 B2 | 12/2007 | Fan et al. |
| 7,321,130 B2 | 1/2008 | Lung et al. |
| 7,323,708 B2 | 1/2008 | Lee et al. |
| 7,323,734 B2 | 1/2008 | Ha et al. |
| 7,332,370 B2 | 2/2008 | Chang et al. |
| 7,336,526 B2 | 2/2008 | Osada et al. |
| 7,351,648 B2 | 4/2008 | Furukawa et al. |
| 7,359,231 B2 | 4/2008 | Venkataraman et al. |
| 7,364,935 B2 | 4/2008 | Lung |
| 7,365,385 B2 | 4/2008 | Abbott |
| 7,379,328 B2 | 5/2008 | Osada et al. |
| 7,385,235 B2 | 6/2008 | Lung |
| 7,388,273 B2 | 6/2008 | Burr et al. |
| 7,394,088 B2 | 7/2008 | Lung |
| 7,397,060 B2 | 7/2008 | Lung |
| 7,400,522 B2 | 7/2008 | Toda et al. |
| 7,423,300 B2 | 9/2008 | Lung et al. |
| 7,426,134 B2 | 9/2008 | Happ et al. |
| 7,440,308 B2 | 10/2008 | Jeong et al. |
| 7,449,710 B2 | 11/2008 | Lung |
| 7,463,512 B2 | 12/2008 | Lung |
| 7,473,576 B2 | 1/2009 | Lung |
| 7,479,649 B2 | 1/2009 | Lung |
| 7,485,891 B2 | 2/2009 | Hamann et al. |
| 7,502,252 B2 | 3/2009 | Fuji et al. |
| 7,507,986 B2 | 3/2009 | Lung |
| 7,514,334 B2 | 4/2009 | Chen et al. |
| 7,514,705 B2 | 4/2009 | Breitwisch et al. |
| 7,515,461 B2 | 4/2009 | Happ et al. |
| 7,541,609 B2 | 6/2009 | Nirschl et al. |
| 7,723,715 B2 | 5/2010 | Czubatyj et al. |
| 7,956,358 B2 | 6/2011 | Chen |
| 2002/0070457 A1 | 6/2002 | Sun et al. |
| 2002/0113273 A1 | 8/2002 | Hwang et al. |
| 2003/0072195 A1 | 4/2003 | Mikolajick |
| 2003/0095426 A1 | 5/2003 | Hush et al. |
| 2003/0186481 A1 | 10/2003 | Lung |
| 2004/0026686 A1 | 2/2004 | Lung |
| 2004/0051094 A1 | 3/2004 | Ooishi |
| 2004/0113137 A1 | 6/2004 | Lowrey |
| 2004/0165422 A1 | 8/2004 | Hideki et al. |
| 2004/0195604 A1 | 10/2004 | Hwang et al. |
| 2004/0248339 A1 | 12/2004 | Lung |
| 2004/0256610 A1 | 12/2004 | Lung |
| 2005/0018526 A1 | 1/2005 | Lee |
| 2005/0029502 A1 | 2/2005 | Hudgens |
| 2005/0052904 A1 | 3/2005 | Cho et al. |
| 2005/0062087 A1 | 3/2005 | Chen et al. |
| 2005/0093022 A1 | 5/2005 | Lung |
| 2005/0127349 A1 | 6/2005 | Horak et al. |
| 2005/0141261 A1 | 6/2005 | Ahn |
| 2005/0145984 A1 | 7/2005 | Chen et al. |
| 2005/0167656 A1 | 8/2005 | Sun et al. |
| 2005/0191804 A1 | 9/2005 | Lai et al. |
| 2005/0195633 A1 | 9/2005 | Choi et al. |
| 2005/0201182 A1 | 9/2005 | Osada et al. |
| 2005/0212024 A1 | 9/2005 | Happ |
| 2005/0212026 A1 | 9/2005 | Chung et al. |
| 2005/0215009 A1 | 9/2005 | Cho |
| 2005/0263829 A1 | 12/2005 | Song et al. |
| 2006/0006472 A1 | 1/2006 | Jiang |
| 2006/0038221 A1 | 2/2006 | Lee et al. |
| 2006/0066156 A1 | 3/2006 | Dong et al. |
| 2006/0073642 A1 | 4/2006 | Yeh et al. |
| 2006/0091476 A1 | 5/2006 | Pinnow et al. |
| 2006/0094154 A1 | 5/2006 | Lung |
| 2006/0108667 A1 | 5/2006 | Lung |
| 2006/0110878 A1 | 5/2006 | Lung et al. |
| 2006/0110888 A1 | 5/2006 | Cho et al. |
| 2006/0113520 A1 | 6/2006 | Yamamoto et al. |
| 2006/0113521 A1 | 6/2006 | Lung |
| 2006/0118913 A1 | 6/2006 | Yi et al. |
| 2006/0124916 A1 | 6/2006 | Lung |
| 2006/0126395 A1 | 6/2006 | Chen et al. |
| 2006/0131555 A1 | 6/2006 | Liu et al. |
| 2006/0138467 A1 | 6/2006 | Lung |
| 2006/0154185 A1 | 7/2006 | Ho et al. |
| 2006/0157680 A1 | 7/2006 | Takaura et al. |
| 2006/0157681 A1 | 7/2006 | Chen et al. |
| 2006/0163554 A1 | 7/2006 | Lankhorst et al. |
| 2006/0172067 A1 | 8/2006 | Ovshinsky et al. |
| 2006/0175599 A1 | 8/2006 | Happ |
| 2006/0198183 A1 | 9/2006 | Kawahara et al. |
| 2006/0202245 A1 | 9/2006 | Zuliani et al. |
| 2006/0205108 A1 | 9/2006 | Maimon et al. |
| 2006/0211165 A1 | 9/2006 | Hwang et al. |
| 2006/0226409 A1 | 10/2006 | Burr et al. |
| 2006/0234138 A1 | 10/2006 | Fehlhaber et al. |
| 2006/0237756 A1 | 10/2006 | Park et al. |
| 2006/0245236 A1 | 11/2006 | Zaidi |
| 2006/0250885 A1 | 11/2006 | Cho et al. |
| 2006/0261392 A1 | 11/2006 | Lee et al. |
| 2006/0266993 A1 | 11/2006 | Suh et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2006/0289847 A1 | 12/2006 | Dodge |
| 2006/0289848 A1 | 12/2006 | Dennison |
| 2007/0007613 A1 | 1/2007 | Wang et al. |
| 2007/0008786 A1 | 1/2007 | Scheuerlein |
| 2007/0030721 A1 | 2/2007 | Segal et al. |
| 2007/0037101 A1 | 2/2007 | Morioka |
| 2007/0040159 A1 | 2/2007 | Wang |
| 2007/0048945 A1 | 3/2007 | Czubatyj et al. |
| 2007/0051936 A1 | 3/2007 | Pellizzer et al. |
| 2007/0063181 A1 | 3/2007 | Czubatyj et al. |
| 2007/0096162 A1 | 5/2007 | Happ et al. |
| 2007/0096248 A1 | 5/2007 | Philipp et al. |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0108836 A1 | 5/2007 | Lung |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0120104 A1 | 5/2007 | Ahn et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0138458 A1 | 6/2007 | Lung |
| 2007/0147105 A1 | 6/2007 | Lung et al. |
| 2007/0153563 A1 | 7/2007 | Nirschl |
| 2007/0154847 A1 | 7/2007 | Chen et al. |
| 2007/0155172 A1 | 7/2007 | Lai et al. |
| 2007/0156949 A1 | 7/2007 | Rudelic et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |

(56) References Cited

U.S. PATENT DOCUMENTS

| | | |
|---|---|---|
| 2007/0170881 A1 | 7/2007 | Noh et al. |
| 2007/0173019 A1 | 7/2007 | Ho et al. |
| 2007/0173063 A1 | 7/2007 | Lung |
| 2007/0176261 A1 | 8/2007 | Lung |
| 2007/0187664 A1 | 8/2007 | Happ |
| 2007/0200202 A1 | 8/2007 | Nowak et al. |
| 2007/0201267 A1 | 8/2007 | Happ et al. |
| 2007/0215852 A1 | 9/2007 | Lung |
| 2007/0224726 A1 | 9/2007 | Chen et al. |
| 2007/0235811 A1 | 10/2007 | Furukawa et al. |
| 2007/0236989 A1 | 10/2007 | Lung |
| 2007/0246699 A1 | 10/2007 | Lung |
| 2007/0249090 A1 | 10/2007 | Philipp et al. |
| 2007/0252127 A1 | 11/2007 | Arnold et al. |
| 2007/0257300 A1 | 11/2007 | Ho et al. |
| 2007/0262388 A1 | 11/2007 | Ho et al. |
| 2007/0267618 A1 | 11/2007 | Zaidi et al. |
| 2007/0274121 A1 | 11/2007 | Lung et al. |
| 2007/0285960 A1 | 12/2007 | Lung et al. |
| 2007/0298535 A1 | 12/2007 | Lung |
| 2008/0006811 A1 | 1/2008 | Philipp et al. |
| 2008/0012000 A1 | 1/2008 | Harshfield |
| 2008/0014676 A1 | 1/2008 | Lung et al. |
| 2008/0025089 A1 | 1/2008 | Scheuerlein et al. |
| 2008/0043520 A1 | 2/2008 | Chen |
| 2008/0094871 A1 | 4/2008 | Parkinson |
| 2008/0101110 A1 | 5/2008 | Happ et al. |
| 2008/0116442 A1 | 5/2008 | Nirschl et al. |
| 2008/0137400 A1 | 6/2008 | Chen et al. |
| 2008/0138929 A1 | 6/2008 | Lung |
| 2008/0138930 A1 | 6/2008 | Lung |
| 2008/0138931 A1 | 6/2008 | Lung |
| 2008/0164453 A1 | 7/2008 | Breitwisch et al. |
| 2008/0165569 A1 | 7/2008 | Chen et al. |
| 2008/0165570 A1 | 7/2008 | Happ et al. |
| 2008/0165572 A1 | 7/2008 | Lung |
| 2008/0166875 A1 | 7/2008 | Lung |
| 2008/0179582 A1 | 7/2008 | Burr et al. |
| 2008/0179584 A1 | 7/2008 | Lung |
| 2008/0180990 A1 | 7/2008 | Lung |
| 2008/0185730 A1 | 8/2008 | Lung |
| 2008/0186755 A1 | 8/2008 | Lung et al. |
| 2008/0191187 A1 | 8/2008 | Lung et al. |
| 2008/0192534 A1 | 8/2008 | Lung |
| 2008/0197334 A1 | 8/2008 | Lung |
| 2008/0224119 A1 | 9/2008 | Burr et al. |
| 2008/0225489 A1 | 9/2008 | Cai et al. |
| 2008/0265234 A1 | 10/2008 | Breitwisch et al. |
| 2008/0303014 A1 | 12/2008 | Goux et al. |
| 2009/0001341 A1 | 1/2009 | Breitwisch et al. |
| 2009/0014704 A1 | 1/2009 | Chen et al. |
| 2009/0023242 A1 | 1/2009 | Lung |
| 2009/0027950 A1 | 1/2009 | Lam et al. |
| 2009/0042335 A1 | 2/2009 | Lung |
| 2009/0057641 A1 | 3/2009 | Lung |
| 2009/0095949 A1* | 4/2009 | Kostylev et al. .......... 257/3 |
| 2009/0098678 A1 | 4/2009 | Lung |
| 2009/0122588 A1 | 5/2009 | Chen |
| 2009/0147564 A1 | 6/2009 | Lung |
| 2009/0166603 A1 | 7/2009 | Lung |
| 2009/0194758 A1 | 8/2009 | Chen |

OTHER PUBLICATIONS

"New Memories Tap Spin, Gird for Battle," Science News, Apr. 3, 1999, p. 223, vol. 155.

"Optimized Thermal Capacitance in a Phase Change Memory Cell Design," IPCOM000141986D, IP.com Prior Art Database, Oct. 18, 2006, 4pp.

"Remembering on the Cheap," www.sciencenews.org, Mar. 19, 2005, p. 189, vol. 167.

"Thermal Conductivity of Crystalline Dielectrics" in CRC Handbook of Chemistry and Physics, Internet Version 2007, (87th edition), David R. Lide, ed. Taylor and Francis, Boca Raton, Fl, 2pp.

Adler, D. et al., "Threshold Switching in Chalcogenide-Glass Thin Films," J. Appl/Phys 51(6), Jun. 1980, pp. 3289-3309.

Adler, David, "Amorphous-Semiconductor Devices," Sci. Amer., vol. 236, pp. 36-48, May 1977.

Ahn, S. J. et al., "A Highly Manufacturable High Density Phase Change Memory of 64 Mb and Beyond," IEEE IEDM Dec. 13-15, 2004, pp. 907-910.

Ahn, S. J. et al., "Highly Reliable 5nm Contact Cell Technology for 256Mb PRAM," VLSI Technology, Digest of Technical Papers, Jun. 14-16, 2005, pp. 98-99.

Atwood, G, et al., "90 nm Phase Change Technology with u Trench and Lance Cell Elements," VLSI Technology, Systems and Applications, Apr. 23-25, 2007, pp. 1-2.

Axon Technologies Corporation paper: Technology Description, published in 1997, pp. 1-6.

Bedeschi, F. et al., "4-MB MOSFET-Selected Phase-Change Memory Experimental Chip," IEEE, Sep. 21 to 23, 2004, 4 PP.

Blake thesis, "Investigation of GeTeSb5 Chalcogenide Films for Use as an Analog Memory," AFIT/GE/ENG/00M-04, Mar. 2000, 121 pages.

Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.

Chen, AN et al., "Non-Volatile Resistive Switching for Advanced Memory Applications," IEEE IEDM, Dec. 5-7 2005, 4 pp.

Cho, S. L. et al., "Highly Scalable On-axis Confined Cell Structure for High Density PRAM beyond 256Mb," Jun. 14-16, 2005 Symposium on VLSI Technology Digest of Technical Papers, pp. 96-97.

Gibson, G. A. et al., "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Gleixner, "Phase Change Memory Reliability", 22nd NVSMW, Aug. 26, 2007, 46 pages.

Ha, Y. H. et al., "An Edge Contact Type Cell for Phase Change RAM Featuring Very Low Power Consumption," Jun. 10-12, 2003 Symposium on VLSI Technology Digest of Technical Papers, pp. 175-176.

Hanzawa, Satoru, et al., "A 512kB Embedded Phase Change Memory with 416kB/s Write Throughput at 100mA Cell Write Current," ISSCC 2007, Session 26, Non-Volatile Memories/26.2, 3 pages.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.

Horii, H. et al., "A Novel Cell Technology Using N-doped GeSbTe Films for Phase Change RAM," Jun. 10-12, 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24um-CMOS Technologies," Jun. 10-12, 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.

Kim, Kinam et al., "Reliability Investigations for Manufacturable High Density PRAM," IEEE 43rd Annual International Reliability Physics Symposium, San Jose, Apr. 17-21, 2005, pp. 157-162.

Kojima, Rie et al., "Ge—Sn—Sb—Te Phase-change Recording Material Having High Crystallization Speed," Proceedings of PCOS 2000, pp. 36-41.

Lacita, A. L., "Electrothermal and Phase-change Dynamics in Chalcogenide-based Memories," IEEE IEDM Dec. 13-15, 2004, 4 pp.

(56) References Cited

OTHER PUBLICATIONS

Lai, Stefan, "Current Status of the Phase Change Memory and Its Future," IEEE IEDM Dec. 10, 2003, pp. 255-258.

Lai, Stephan et al., "OUM-A 180 nm Nonvolatile Memory Cell Element Technology for Stand Alone and Embedded Applications," IEEE IEDM Dec. 2-5, 2001, pp. 803-806.

Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.

Matsui, Y., et al, "Ta2O5 Interfacial Layer between GST and W Plug enabling Low Power Operation of Phase Change Memories," IEEE 2006, 4 pages.

Mott, Nevill, "Electrons in Glass," Nobel Lecture, Dec. 8, 1977, Physics, 1977, pp. 403-413.

Oh, Hyung-Rok, et al., "Enhanced Write Performance of a 64Mb Phase-Change Random Access Memory," ISSCC 2005, Session 2, Non-Volatile Memory, 2.3, 3 pages.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al.,"Novel u Trench Phase-Change Memory Cell for Embedded and Stand-Alone Non-Volatile Memory Applications," Jun. 15-17, 2004 Symposium on VLSI Technology Digest of Technical Papers, pp. 18-19.

Pirovano, Agostino et al.,"Reliability Study of Phase-Change Nonvolatile Memories," IEEE Transactions on Device and Materials Reliability, Sep. 2004, pp. 422-427, vol. 4, No. 3.

Prakash, S. et al., "A guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n Junctions Using Vapor Phase Doping for Application in Multi-Resurf Devices," IEEE Jun. 4-7, 2002, pp. 237-240.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Strauss, Karl F. et al., "Overview of Radiation Tolerant Unlimited Write Cycle Non-Volatile Memory," IEEE Mar. 18-25, 2000, pp. 399-408.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8pages.

Wicker, Guy, "A Comprehensive Model of Submicron Chalcogenide Switching Devices," Doctoral Dissertation, Wayne State University, Detroit, MI 1996, 137 pp.

Wolf, Stanley, Excerpt from: Silicon Processing for the VLSI Era—vol. 4, pp. 674-679, 2004.

Wuttig, Matthias, "Towards a Universal Memory?" Nature Materials, Apr. 2005, pp. 265-266, vol. 4.

Yamada, Noboru, "Potential of Ge—Sb—Te phase-change optical disks for high-data-rate recording in the near future," (Conference Proceedings Paper), Jul. 30, 1997, vol. 3109, 10 pages.

Yi, J. H. et al., "Novel Cell Structure of PRAM with Thin Metal Layer Inserted GeSbTe," IEEE IEDM Dec. 10, 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

Mar. 30, 2012 Office Action in related application CN 201010166201, untranslated, 4 pp.

\* cited by examiner

LOW OPERATIONAL CURRENT PHASE CHANGE MEMORY STRUCTURES

CROSS-REFERENCE TO RELATED APPLICATIONS

This application is a divisional of co-pending U.S. patent application Ser. No. 12/433,573 filed on 30 Apr. 2009, entitled Low Operational Current Phase Change Memory Structures, which application is incorporated by reference herein.

BACKGROUND OF THE INVENTION

1. Field of the Invention

The present invention relates to phase change based memory materials, and to methods for manufacturing such devices.

2. Description of Related Art

Phase change based memory materials, like chalcogenide based materials and similar materials, can be caused to change phase between an amorphous and a crystalline state by application of electrical current at levels suitable for implementation in integrated circuits. The generally amorphous state is characterized by higher electrical resistivity than the generally crystalline state, which can be readily sensed to indicate data. These properties have generated interest in using programmable resistance material to form nonvolatile memory circuits, which can be read and written with random access.

The change from the amorphous to the crystalline, referred to as set herein, is generally a lower current operation in which current heats the phase change material above a transition temperature to cause a transition of an active region from the amorphous to the crystalline phase. The change from the crystalline to the amorphous, referred to as reset herein, is generally a higher current operation, which includes a short high current density pulse to melt or breakdown the crystalline structure, after which phase change material cools quickly, quenching the phase change process and allowing at least a portion of the active region of the phase change material to stabilize in the amorphous phase. Techniques are applied to make the active region small, so that the amount of current needed to induce the phase change is reduced.

The magnitude of the current needed can be reduced by reducing the size of the phase change material element and/or the size of electrodes in contact with the phase change material element, so that higher current densities are achieved in the active region with small absolute current values.

One approach to controlling the size of the active region is to devise very small electrodes for delivering current to a body of phase change material. This small electrode structure concentrates current in a small area like the head of a mushroom, at the location of the contact. See, U.S. Pat. No. 6,429,064, issued Aug. 6, 2002 to Wicker, "Reduced Contact Areas of Sidewall Conductor"; U.S. Pat. No. 6,462,353, issued Oct. 8, 2002, to Gilgen, "Method for Fabricating a Small Area of Contact Between Electrodes"; U.S. Pat. No. 6,501,111, issued Dec. 31, 2002, to Lowrey, "Three-Dimensional (3D) Programmable Device"; U.S. Pat. No. 6,563,156, issued Jul. 1, 2003, to Harshfield, "Memory Elements and Methods for Making Same".

Another approach to controlling the size of the active region includes spacing the electrodes in such a way that current flowing therebetween is concentrated by the thickness of a thin layer of phase change material. See, U.S. Patent Application Publication No. US 2007/0048945, entitled "Memory Device and Method of Making Same", by Czubatyj, et al. See also the following applications and patents commonly owned by the assignee of the present application: U.S. patent application Ser. No. 11/864,273, filed 28 Sep. 2007, entitled "Memory Cell Having A Side Electrode Contact", by Lung; U.S. Pat. No. 7,463,512, issued 9 Dec. 2008, entitled "Memory Element with Reduced-Current Phase Change Element", by Lung; U.S. application Ser. No. 12/023,978, filed 7 Aug. 2008, entitled "Memory Cell Device with Coplanar Electrode Surface and Method", by Lung.

A specific issue arising from conventional phase change memory cell structures is the heat sink effect of electrodes in contact with the phase change material. Because the phase change occurs as a result of heating, the thermal conductivity of the electrodes will act to draw heat away from the active region, resulting in a need for a higher current to induce the desired phase change.

Higher current levels can result in electrical and mechanical reliability problems for the memory cell. These problems include the formation of voids at the phase change material/electrode interface due to mechanical stress caused by thermal expansion and material density changes during operation.

Additionally, higher current levels can result in problems such as localized heating sufficient to induce diffusion/reaction of electrode and phase change material, and/or cause compositional changes in the phase change material within the active region, resulting in resistive switching performance degradation and possible failure of the memory cell.

Thus, various techniques are used in an attempt to thermally isolate the active region so that the resistive heating needed to induce the phase change is confined to the active region.

One approach to improving thermal isolation includes using gaps or voids adjacent the phase change material. See U.S. Pat. No. 6,815,704, issued 9 Nov. 2004, entitled "Phase Change Memory Device Employing Thermally Insulating Voids", by Chen.

It has also been proposed to use thermally insulating materials to improve the confinement of heat to the active region. See, for example, U.S. patent application Ser. No. 11/940,164, filed 14 Nov. 2007, entitled "Phase Change Memory Cell Including Thermal Protect Bottom Electrode and Manufacturing Methods", by Chen.

Another approach to improving thermal isolation includes forming the phase change material and electrodes in a way that tends to space the active region from the electrodes. See the following applications commonly owned by the assignee of the present application: U.S. patent application Ser. No. 11/348,848, filed 7 Sep. 2006, entitled "I-Shaped Phase Change Memory Cell", by Chen et al.; U.S. patent application Ser. No. 11/952,646, filed 7 Dec. 2007, entitled "Phase Change Memory Cell Having Interface Structures with Essentially Equal thermal Impedances and Manufacturing Methods", by Lung; U.S. application Ser. No. 12/026,342, filed 5 Feb. 2005, entitled "Heating Center PCRAM Structure and Methods for Making", by Chen.

Accordingly, an opportunity arises to devise phase change memory cell structures requiring a small amount of current to induce phase change in the active region. Furthermore, it is desirable to provide methods for manufacturing such devices.

SUMMARY OF THE INVENTION

Phase change based memory cells having small operational currents are described herein. The memory cells include an electrode having a contact surface through which current flow is confined, and a phase change memory element in contact with the contact surface of the electrode. The memory cells further include means for redirecting current within a short distance of the contact surface so that is flows laterally within the phase change memory element relative to the direction of current flow at the contact surface, to increase current density within regions of the phase change memory element over edges of the contact surface. This forces current to flow through lateral edge regions of an active region centered over the electrode. By forcing current to flow through lateral edge regions, the current density and thus the amount of heat generated within the edge regions per unit value of current is increased relative to that of conventional mushroom-type memory cells. As a result, the amount of current needed to induce phase change is smaller.

Since the edge regions are laterally spaced away from the center of the underlying electrode, the electrode acts to drawn heat away from the center region of the active region more rapidly than the edge regions. As a result, forcing the current to flow through the lateral edge regions of the active region to generate heat therein acts to restrict heat flow away from the memory element. Thus, the heat sink effect the electrode has on the active region is reduced, effectively increasing the amount of heat generated within the memory element per unit value of current and reducing the amount of current required to induce a phase change.

A memory device as described herein comprises a first electrode having a contact surface through which current flow is confined. A phase change memory element is in contact with the contact surface of the first electrode, the phase change memory element having a width greater than that of the first electrode. A second electrode is electrically coupled to the phase change memory element. The memory device further includes means for defining an inter-electrode current path between the first and second electrodes that turns laterally within the phase change memory element relative to the direction of current flow at the contact surface. The means include a dielectric element on the phase change memory element, and an electrically conductive element on the dielectric element. The conductive element comprises material having an electrical conductivity greater than that of material of the dielectric element.

One embodiment of a memory device described herein comprises a phase change memory element having a top surface, a bottom surface, a side surface, and a thickness between the top and bottom surfaces. An electrically insulating element is on the top surface of the phase change memory element. A thermal isolation element is on the electrically insulating element, the thermal isolation element comprising material having a thermal conductivity less than that of material of the electrically insulating element. A bottom electrode contacts the bottom surface of the phase change memory element at a first contact surface, the first contact surface when projected above the bottom electrode defining a cylinder having sides extending the thickness of the phase change memory element, said sides of the cylinder having a surface area less than or equal to twice that of the first contact surface. A side electrode contacts the side surface of the phase change memory element at a second contact surface.

In operation, the arrangement of the bottom and side electrodes and the electrically insulating element forces the inter-electrode current path through the first contact surface from the bottom electrode to turn laterally to flow through the second contact surface and into the side electrode. As a result of the sides of the cylinder having a surface area less than or equal to twice that of the first contact surface, in operation the average current density through the sides of the cylinder is greater than or equal to half the average current density through the first contact surface. This acts to concentrate the current density at the edges of the active region, thereby reducing the magnitude of the current needed to induce a phase change in the active region for the reasons discussed above.

In addition, the active region can be made extremely small, further reducing the amount of current needed. The thickness of the memory material of the memory element can be established using a thin film deposition technique of memory material on the top surface of the bottom electrode. Furthermore, the bottom electrode has a width that is preferably less than a minimum feature size for a process, typically a lithographic process, used to form the memory device. The small bottom electrode concentrates current density in the portion of the memory element adjacent the bottom electrode, thereby reducing the amount of current needed. Additionally, the electrically insulating element and the thermal isolation element provide thermal isolation to the active region, which also helps to reduce the amount of current needed to induce a phase change.

Thus, the electrodes, the thickness of the phase change memory element, and the electrically insulating element provide means for redirecting current within a short distance of the first contact surface so that is flows laterally within the phase change memory element relative to the direction of current flow at the first contact surface, to increase current density within regions of the phase change memory element over edges of the first contact surface.

Another embodiment of a memory device described herein comprises a first electrode having a top surface and an outer surface. A second electrode has a top surface substantially coplanar with the top surface of the first electrode, and has an inner surface surrounding the outer surface of the first electrode. The second electrode comprises a first material at the top surface and a second material underlying the first material, the first material having a thermal conductivity less than that of the second material. An insulating element is between the outer surface of the first electrode and the inner surface of the second electrode. A phase change memory element extends across the insulating element to contact the top surfaces of the first electrode and the second electrode.

In operation, the coplanar top surfaces of the first electrode and the second electrode, along with the insulating element between them, forces the inter-electrode current path through the top surface of the first electrode to turn laterally to flow through the phase change memory element and into the top surface of the second electrode. This acts to concentrate the current density at the edges of the active region, thereby reducing the magnitude of the current needed to induce a phase change in the active region.

In addition, the active region can be made extremely small, further reducing the amount of current needed. The thickness of the memory material of the memory element can be established using a thin film deposition technique of memory material on the top surfaces of the first and second electrodes. Furthermore, the first electrode has a width that is preferably less than a minimum feature size for a process, typically a lithographic process, used to form the memory device. The small first electrode concentrates current density in the portion of the memory element adjacent the first electrode, thereby reducing the amount of current needed. Furthermore, the relatively low thermal conductivity of the first material acts to reduce the amount of heat drawn away from the phase change memory element by the second electrode, reducing the heat sink effect of the second electrode and effectively increasing the amount of heat generated within the phase change memory element per unit value of current.

Thus, the electrodes and the insulating element provide means for redirecting current within a short distance of the top surface of the first electrode so that it flows laterally within the phase change memory element relative to the direction of current flow at the top surface of the first electrode, to increase current density within regions of the phase change memory element over edges of the top surface of the first electrode.

Yet another embodiment of a memory device described herein comprises a bottom electrode and a phase change memory element on the bottom electrode, the phase change memory element having a width greater than that of the bottom electrode. A tunneling dielectric element on the phase change memory element, and a top electrode is overlying and electrically coupled to the dielectric tunneling element.

The tunneling dielectric element comprises dielectric material having a thickness sufficient to allow charge to tunnel along inter-electrode path through the tunneling dielectric element by an electric field induced by voltages applied to the top electrode and bottom electrode. The relatively high electrical conductivity of the phase change material of the phase change memory element beneficially affects the uniformity of the electric field across the tunneling dielectric element to cause some of the current in the phase change memory element to turn laterally and flow through the edge regions of the active region of the phase change memory element. The increased current density at the edge regions of the active region thus increases the amount of heat generated within the edge regions per unit value of current. Additionally, increasing the current density and heat generated at the edges reduces the heat sink effect of the bottom electrode.

Thus, the electrodes, the tunneling dielectric element, and the electrically conductive element provide means for redirecting current within a short distance of the top surface of the bottom electrode so that it flows laterally within the phase change memory element relative to the direction of current flow at the top surface of the bottom electrode, to increase current density within regions of the phase change memory element over edges of the top surface of the bottom electrode.

In addition to the inter-electrode path through the tunneling dielectric element, in some embodiments the top electrode of the memory device further contacts the side surface of the phase change memory element to define a second inter-electrode current path between the top electrode and the bottom electrode through the side surface of the phase change memory element. The additional current path is useful for providing adequate current through the memory cell during read operations.

Other aspects and advantages of the present invention can be seen on review of the drawings, the detailed description, and the claims which follow.

DETAILED DESCRIPTION

Figure 1:
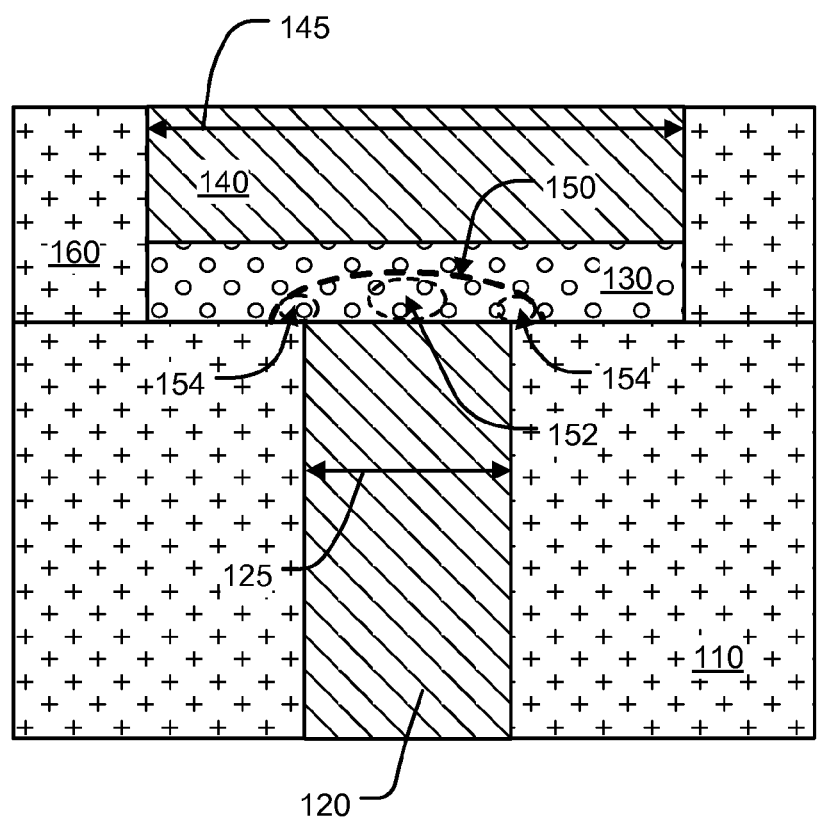
FIG. 1 illustrates a cross-sectional view of a prior-art "mushroom-type" memory cell.

The following description of the disclosure will typically be with reference to specific structural embodiments and methods. It is to be understood that there is no intention to limit the disclosure to the specifically disclosed embodiments and methods, but that the disclosure may be practiced using other features, elements, methods and embodiments. Preferred embodiments are described to illustrate the present disclosure, not to limit its scope, which is defined by the claims. Those of ordinary skill in the art will recognize a variety of equivalent variations on the description that follows. Like elements in various embodiments are commonly referred to with like reference numerals.

FIG. 1 illustrates a cross-sectional view of a prior art "mushroom-type" memory cell 100 having a bottom electrode 120 extending through a dielectric layer 110, a phase change memory element 130 comprising a layer of phase change material on the bottom electrode 120, and a top electrode 140 on the phase change material 130. A dielectric layer 160 surrounds the layer of phase change material 130. As can be seen in FIG. 1, the bottom electrode 120 has a width 125 less than the width 145 of the top electrode 140 and phase change material 130.

In operation, voltages on the top and bottom electrodes 140, 120 induce a current to flow from the top electrode 140 to the bottom electrode 120, or vice-versa, via the phase change memory element 130.

The active region 150 is the region of the phase change memory element 130 in which the phase change material is induced to change between at least two solid phases. Due to the differences in the widths 125 and 145, in operation the current density is concentrated in the region of the phase change memory element 130 adjacent the bottom electrode 120, resulting in the active region 150 having a "mushroom" shape as shown in FIG. 1.

Since the current flow path between the top electrode 140 and the bottom electrode 120 is generally vertical, the current density and thus heat generated at the center 152 of the active region 150 will be much larger than at the edges 154 of the active region 150.

As a result, when the edges 154 of the active region 150 are heated to a temperature sufficient to induce the desired phase change, the center 152 can experience localized heating sufficient to cause electrical and mechanical reliability problems for the memory cell 100.

These problems can include the formation voids at the interface between the phase change memory element 130 and the bottom electrode 120 due to mechanical stress caused by thermal expansion and material density changes during operation. In addition, the center 152 may experience localized heating sufficient to induce diffusion/reaction of material of the bottom electrode 120 and the phase change material 130, and/or may cause compositional changes in the phase change material 130 at the center 154. These problems can result in resistive switching performance degradation and possible failure of the memory cell 100.

Furthermore, the thermal conductivity of the bottom electrode 120 will act to draw heat away from the active region 150 and result in a significant amount of heat loss within the center 152 of the active region 150. The high heat loss within the center 152 of the active region 150 results in a need for higher current to induce the desired phase change in the active region 150.

Figure 2A:
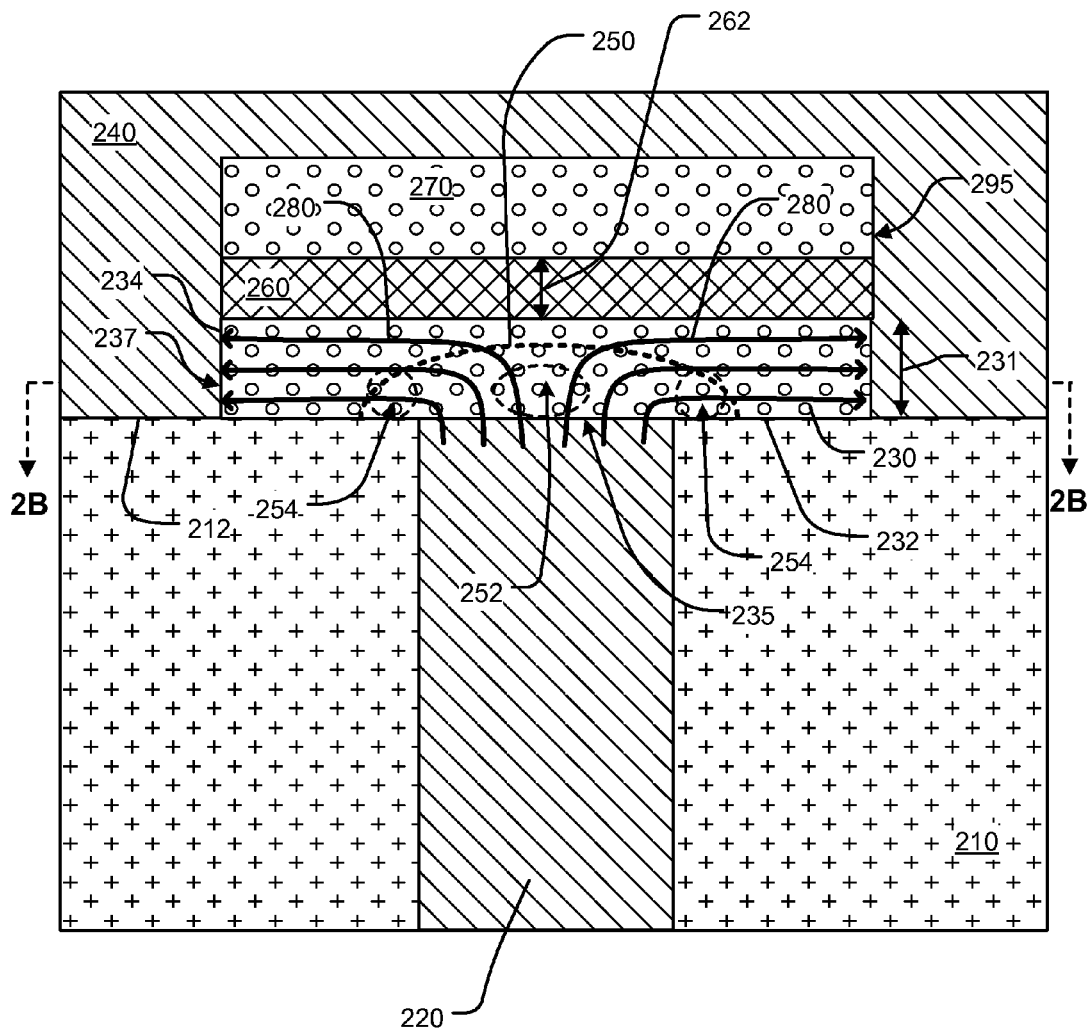
FIG. 2A illustrates a cross-sectional view of a first embodiment of a memory cell having increased current density at edges of an active region.
Figure 2B:
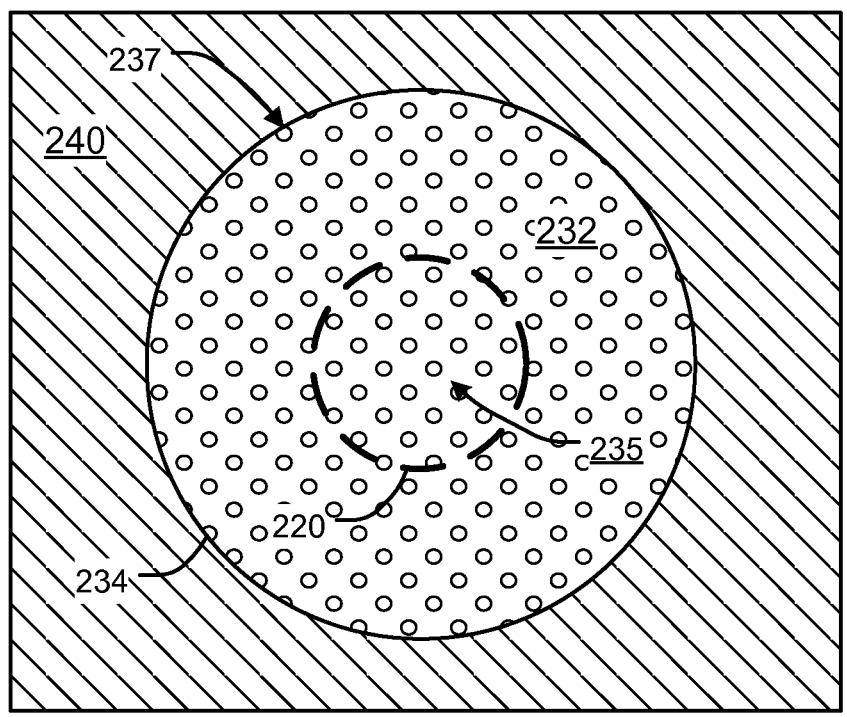
FIG. 2B is top view of the memory cell of FIG. 2A taken along the line 2B-2B.

FIG. 2A is a cross-sectional view of a first embodiment of a memory cell 200 having increased current density at edges of an active region compared to that of the memory cell 100 of FIG. 1, resulting in improved operational current efficiency and reliability. FIG. 2B is a top view of the memory cell 200 taken along line 2B-2B.

The memory cell 200 includes a bottom electrode 220 contacting the bottom surface 232 of a phase change memory element 230 at a first contact surface 235. The bottom electrode 220 may comprise, for example, TiN or TaN. TiN may be preferred in embodiments in which the phase change memory element 230 comprises GST (discussed in more detail below) because it makes good contact with GST, it is a common material used in semiconductor manufacturing, and it provides a good diffusion barrier at the higher temperatures at which GST transitions, typically in the 600-700° C. range. Alternatively, the bottom electrode 220 may be W, WN, TiAlN or TaAlN, or comprise, for further examples, one or more elements selected from the group consisting of doped-Si, Si, C, Ge, Cr, Ti, W, Mo, Al, Ta, Cu, Pt, Ir, La, Ni, N, O, and Ru and combinations thereof.

The phase change memory element 230 may comprise, for example, one or more materials from the group of Zn, To, Tl, Ge, Sb, Te, Se, In, Ti, Ga, Bi, Sn, Cu, Pd, Pb, Ag, S, Si, O, P, As, N and Au.

The bottom electrode 220 extends from the top surface 212 of the dielectric 210 to couple the phase change memory element 230 to underlying access circuitry (not shown). The dielectric 210 may comprise, for example, silicon dioxide. Alternatively, the dielectric 210 may comprise other dielectric materials.

The memory cell 200 includes a side electrode 240 contacting the outer surface 234 of the phase change memory element 230 at a second contact surface 237. The side electrode 240 may comprise, for example, any of the materials discussed above with reference to the bottom electrode 220.

An electrically insulating dielectric element 260 is on the top surface of the phase change memory element 230. As discussed in more detail below, the electrically insulating element 260 comprises electrically insulating material having a thickness 262 sufficient to force the inter-electrode current path 280 through the first contact surface 235 from the bottom electrode 230 to turn laterally to flow through the second contact surface 237 and into the side electrode 240.

The thickness 262 of the dielectric element 260 necessary to prevent a vertical inter-electrode current path between the bottom electrode 220 and the overlying side electrode 240 is dependent upon the material of the dielectric element 260, as well as the operating voltages applied to the side and bottom electrodes 240, 220 during operation of the memory cell 200. The necessary thickness 262 and can be determined empirically for each embodiment. In certain embodiments the dielectric element 260 comprises one of silicon dioxide, silicon nitride, aluminum oxide, and ruthenium oxide. In certain embodiments, the thickness 262 is between about 5 Angstroms and 200 Angstroms, for example being about 30 Angstroms.

The memory cell 200 also includes an electrically conductive element 270 on the electrically insulating element 260. The electrically conductive element 270 comprises material having an electrically conductivity greater than that of material of the electrically insulating element.

In the illustrated embodiment, the phase change memory element 230, the electrically insulating element 260, and the electrically conductive element 270 form a stack having a sidewall surface 295. The side electrode 240, comprising for example a portion of a bit line, is on the stack and contacts the sidewall surface 295 of the stack.

In the illustrated embodiment the material of the electrically conductive element 270 has a thermal conductivity less than that of the electrically insulating material of the electrically insulating element 260.

Thus, the electrically conductive element 270 acts as a heat insulator to reduce the amount of heat drawn away from the phase change memory element 230 by the overlying side electrode 240. The thermal conductivity of the electrically conductive element 270 is preferably at most 60%, and more preferably at most 20% of the thermal conductivity of the material of the dielectric element 260.

In some embodiments the electrically conductive element 270 comprises a phase change memory material, for example comprising the elements Ge, Sb, and Te. The electrically conductive element 270 may comprise, for example, the same material as the phase change memory element 230. Alternatively, the electrically conductive element 270 may comprise a compound having a different ratio of elements than that of the phase change memory element 230, for example the phase change memory element 230 comprising Ge2Sb2Te5 and the electrically conductive element 270 comprising the elements Ge, Sb, and Te in another ratio. An advantage of using the same material for the phase change memory element 230 and the electrically conductive element 270 is that the diffusion effect between the phase change memory element 230 and the electrically conductive element 270 is less of a concern. The electrically conductive element 270 may comprise a chalcogenide or other phase change material doped with impurities in some embodiments to modify conductivity, transition temperature, melting temperature, and other properties. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. In certain embodiments the thickness of the electrically conductive element 270 is less than or equal to 100 nm, for example being between about 10 nm and 100 nm.

Referring to the top view of FIG. 2B, in the illustrated embodiment the phase change memory element 230 has a circular cross-section, resulting in the phase change memory element 230 having a circular outer surface 234. However, in embodiments the phase change memory element 230 may have a cross-section that is circular, elliptical, square, rectangular, or somewhat irregularly shaped, depending upon the manufacturing technique used to form the phase change memory element 230 and the side electrode 240. In addition, in certain embodiments the outer surface 234 may be tapered inwardly or outwardly from the bottom surface 230 to the top surface 233.

Referring back to FIG. 2A, in operation voltages on the bottom electrode 220 and the side electrode 240 induce a current to flow along path 280 from the bottom electrode 220 to the side electrode 240, or vice versa, through the phase change memory element 230 via contact surfaces 235 and 237.

As such, in operation the current is forced to turn laterally and flow through the edge regions 254 of the active region 250, which increases the current density and thus the amount of heat generated within the edge regions 254 per unit value of current.

Thus, the electrodes 220, 240, the thickness 231 of the phase change memory element 230, the electrically insulating element 260, and the electrically conductive element 270 provide means for redirecting current within a short distance of the first contact surface 235 so that is flows laterally within the phase change memory element 230 relative to the direction of current flow at the first contact surface 235, to increase current density within regions of the phase change memory element 230 over edges of the first contact surface 235.

Figure 2C:
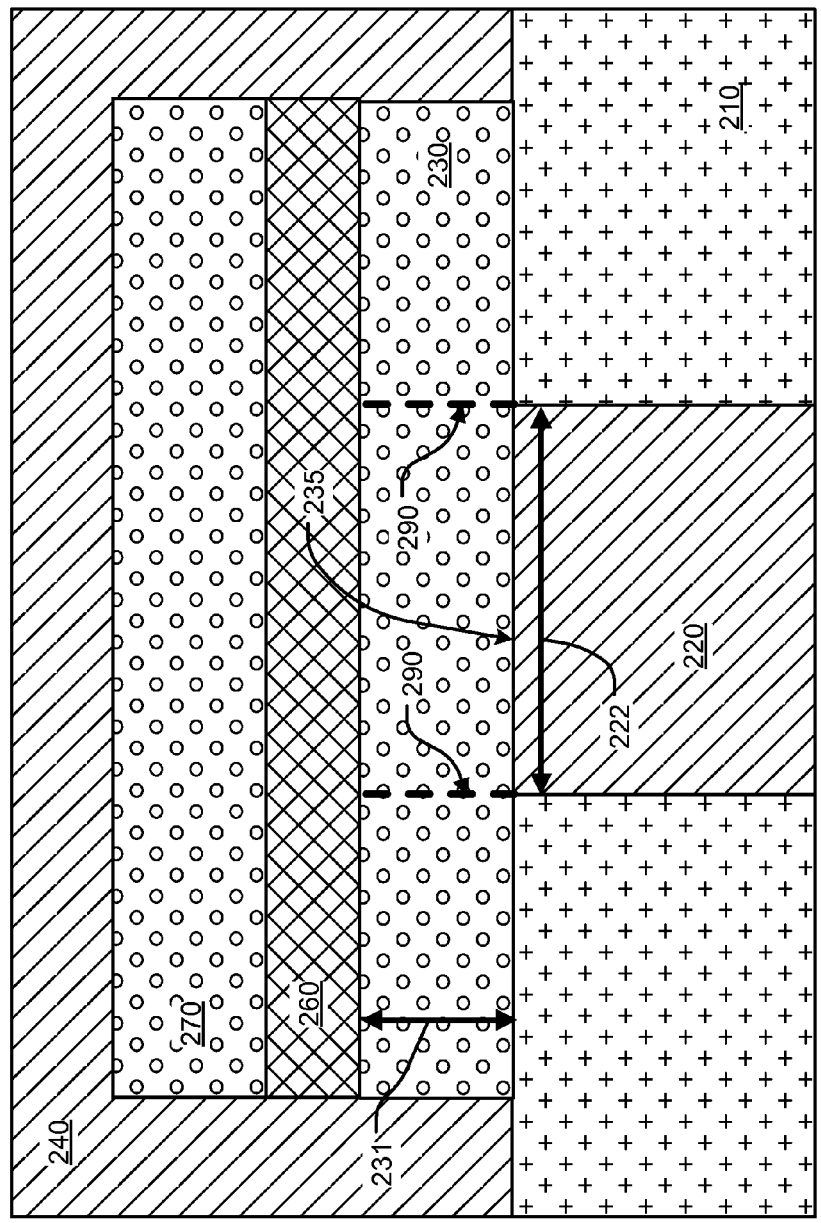
FIG. 2C is an expanded view of the cross-sectional view of FIG. 2A.

FIG. 2C is an expanded view of the cross-sectional view of the FIG. 2A. The contact surface 235 between the bottom electrode 220 and the phase change memory element 230, when projected above the bottom electrode 220, defines a cylinder having sides 290 extending the thickness 231 of the phase change memory element 230.

The sides 290 of the cylinder have a surface area A1 less than or equal to twice the surface area A2 of the contact surface 235. As a result, in operation the average current density though sides 290 of the cylinder is greater than or equal to half the average current density of the contact surface 235. This acts to concentrate the current density at the edges 254 of the active region 250 (See FIG. 2A), thereby reducing the magnitude of the current needed to induce a phase change in the active region 250. Additionally, increasing the current density and heat generated at the edges 254 can reduce the heat sink effect of the bottom electrode 220.

In the illustrated embodiment the bottom electrode 220 has a diameter 222 at the contact surface 235. As a result, the surface area A1 of the contact surface 235 in the illustrated embodiment is given by the following equation (1):

$$A1 = \pi \cdot D^2 / 4 \qquad \text{(Equation 1)}$$

where D is the diameter 222 of the bottom electrode 220. In certain embodiments the diameter 222 of the bottom electrode is less than or equal to 130 nm.

Additionally, the surface area A2 of the sides 290 of the cylinder is given by the following equation (2):

$$A2 = \pi \cdot D \cdot t \qquad \text{(Equation 2)}$$

where t is the thickness 231 of the phase change memory element 230.

As noted above, the surface area A1 of the sides 290 is less than or equal to twice the surface area A2 of the contact surface 235. Thus, in the illustrated embodiment using equations 1 and 2 above, the thickness 231 of the phase change memory element 230 is less than or equal to half the diameter 222 of the bottom electrode 220.

Since the current turns to flow laterally through the phase change memory element 230, reducing the thickness 231 relative the diameter 222 of the bottom electrode 220 acts to increase the average current density through the sides 290 relative to the average current density through the contact surface 235. In certain embodiments the thickness 231 is less than or equal to 25% of the diameter 222 of the bottom electrode 220, further concentrating current at the edges 254 of the active region 250.

The thickness 231 of the phase change memory element 230 can be established using a thin film deposition technique of phase change material on the top surfaces of the dielectric 210 and bottom electrode 220, and thus can be very thin relative to the diameter 222 of the bottom electrode 220. In some embodiments the thickness 231 is less than 50 nm, for example being less than 10 nm. As a result, in some embodiments the thickness 231 is less than or equal to 50% of the diameter of the bottom electrode 220, for example being less than or equal to 25%.

In the illustrated embodiment, the sides 290 have a circular cross-section since the bottom electrode 220 and thus the contact surface 235 has a circular cross-section. Alternatively, the sides 290 of the cylinder may have a cross-section that is square, elliptical, rectangular, or somewhat irregularly shaped, depending on the cross-sectional shape of the bottom electrode 220 and thus the contact surface 235.

FIGS. 3A-3D illustrate an embodiment of steps in a fabrication sequence for manufacturing the memory cell of FIGS. 2A-2C. Bottom electrode 220 is formed extending to the top surface 212 of dielectric 210, resulting in the structure shown in the cross-sectional view of FIG. 3A.

The bottom electrode 220 and dielectric 210 can be formed, for example, by forming a layer of bottom electrode material on the top surface of access circuitry (not shown), followed by patterning of a layer of photoresist on the electrode layer using standard photo lithographic techniques so as to form a mask of photoresist overlying the location of the bottom electrode 220. Next the mask of photoresist is trimmed, using for example oxygen plasma, to form a mask structure having sublithographic dimensions overlying the location of the bottom electrode 220. Then the layer of electrode material is etched using the trimmed mask of photoresist, thereby forming the bottom electrode having a sublithographic diameter 222. Next dielectric material 210 is formed and planarized, resulting in the structure illustrated in FIG. 3A.

As another example, the bottom electrode 220 and dielectric 210 can be formed by forming the dielectric 210 on the top surface of access circuitry followed by sequentially forming an isolation layer and a sacrificial layer. Next, a mask having openings close to or equal to the minimum feature size of the process used to create the mask is formed on the sacrificial layer, the openings overlying the location of the bottom electrode 220. The isolation layer and the sacrificial layers are then selectively etched using the mask, thereby forming a via in the isolation and sacrificial layers and exposing a top surface of the dielectric layer 210. After removal of the mask, a selective undercutting etch is performed on the via such that the isolation layer is etched while leaving the sacrificial layer and the dielectric layer 210 intact. A fill material is then formed in the via, which due to the selective undercutting etch process results in a self-aligned void in the fill material being formed within the via. Next, an anisotropic etching process is performed on the fill material to open the void, and etching continues until the dielectric layer 210 is exposed in the region below the void, thereby forming a sidewall spacer comprising fill material within the via. The sidewall spacer has an opening dimension substantially determined by the dimensions of the void, and thus can be less than the minimum feature size of a lithographic process. Next, the dielectric layer 210 is etched using the sidewall spacers as an etch mask, thereby forming an opening in the dielectric layer 210 having a diameter less than the minimum feature size. Next, an electrode layer is formed within the openings in the dielectric layer 210. A planarizing process, such as chemical mechanical polishing CMP, is then performed to remove the isolation layer and the sacrificial layer and to form the bottom electrode 220, resulting in the structure illustrated in FIG. 3A.

Figure 3A:
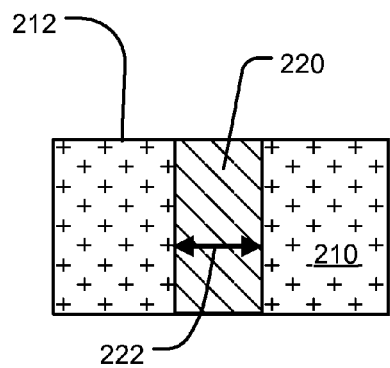
FIGS. 3A-3D illustrate an embodiment of steps in a fabrication sequence for manufacturing the memory cell of FIGS. 2A-2C.
Figure 3B:
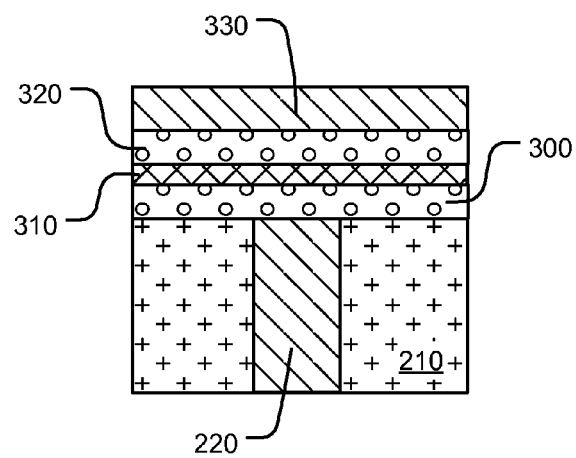

Next, a phase change memory element material 300 is formed on the structure illustrated in FIG. 3A, electrically insulating element material 310 is formed on the phase change memory element material 300, electrically conductive element material 320 is formed on the electrically insulating element material 310, and electrode material 330 is formed on the electrically conductive element material 320, resulting in the structure illustrated in the cross-sectional view of FIG. 3B.

Figure 3C:
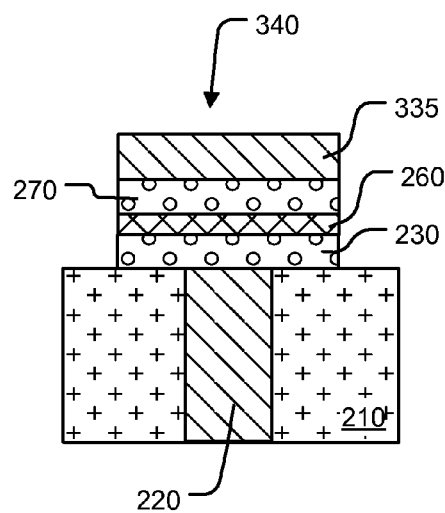

The materials 300, 310, 320, and 330 are then patterned to form stack 340, resulting in the structure illustrated in the cross-sectional view of FIG. 3C. The stack 340 includes phase change memory element 230, electrically insulating element 260, electrically conductive element 270, and upper portion 335 of the side electrode 240.

Figure 3D:
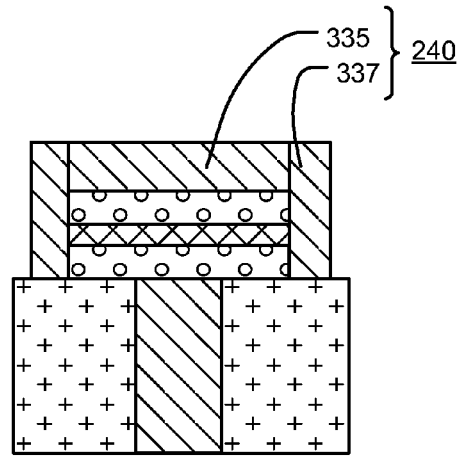

Next, a conductive layer is formed on the structure illustrated in FIG. 3C including on the sidewall surface of the stack 335, and the conductive layer is anisotropically etched to form sidewall portions 337 of the side electrode 240, resulting in the structure illustrated in the cross-sectional view of FIG. 3D.

Figure 4A:
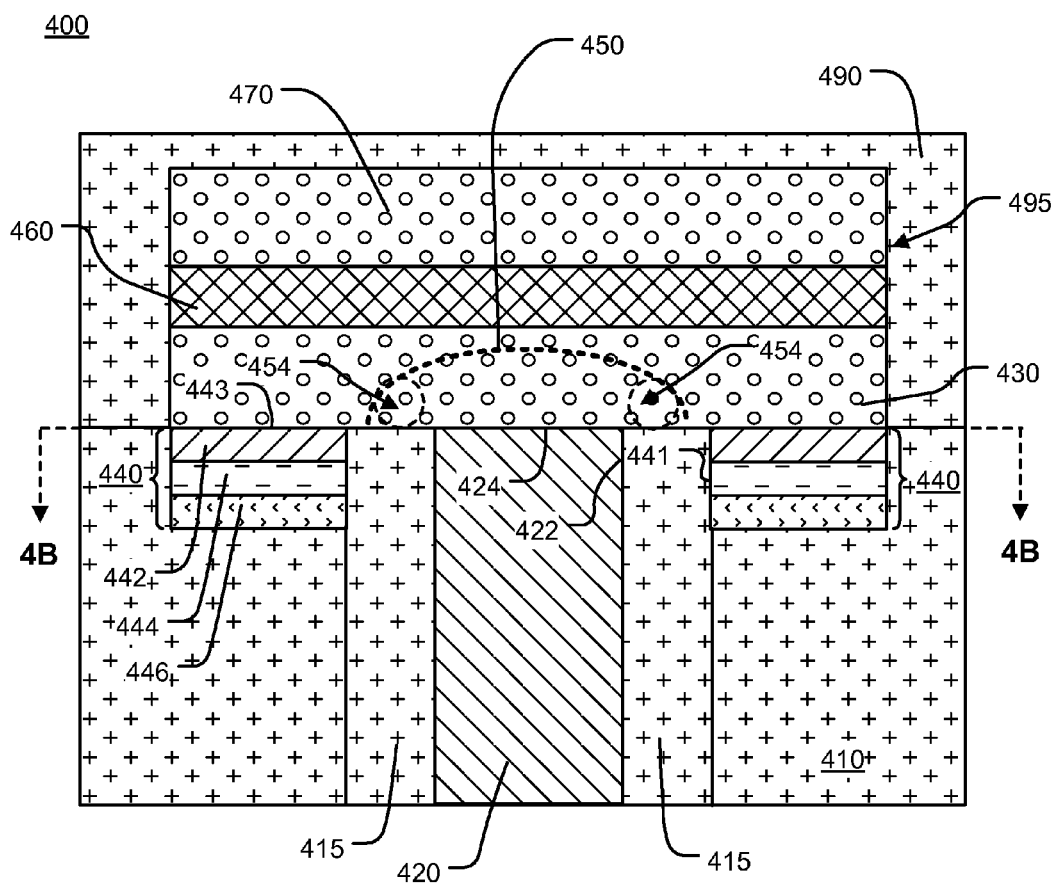
FIG. 4A illustrates a cross-sectional view of a second embodiment of a memory cell having increased current density at edges of an active region.
Figure 4B:
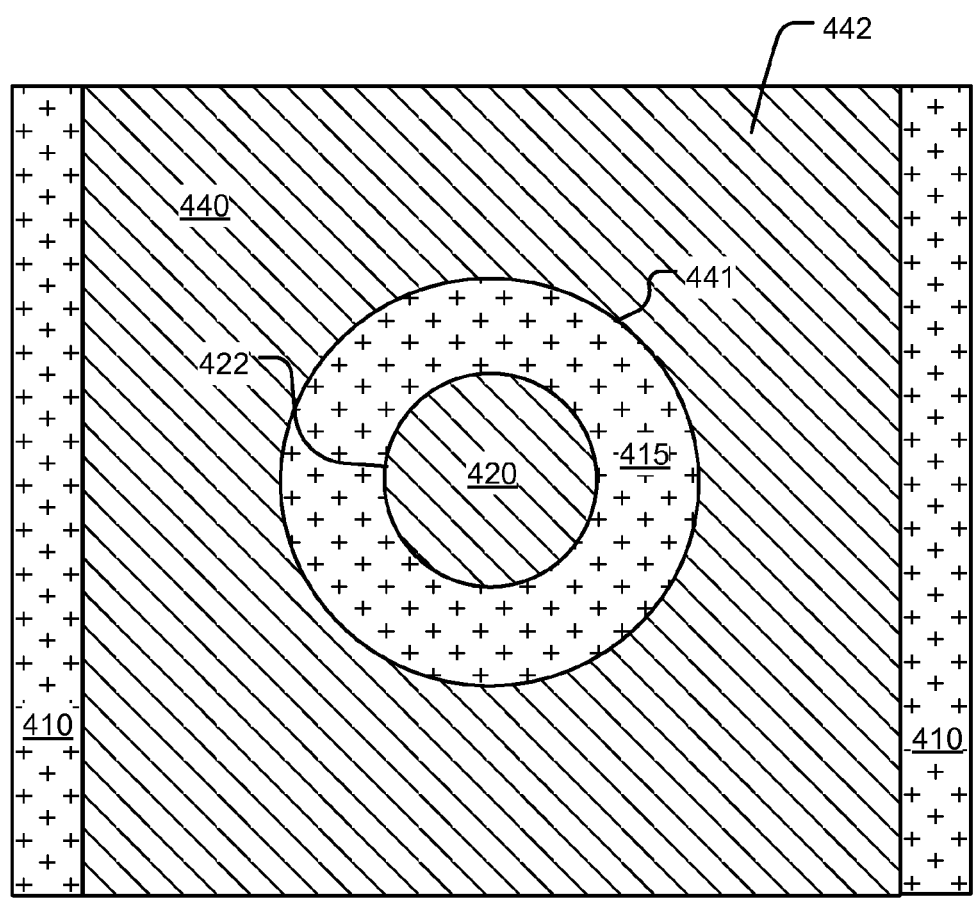
FIG. 4B is top view of the memory cell of FIG. 2A taken along the line 4B-4B.

FIG. 4A is a cross-sectional view of a second embodiment of a memory cell 400 having increased current density at edges of an active region compared to that of the memory cell 100 of FIG. 1, resulting in improved operational current efficiency and reliability. FIG. 4B is a top view of the memory cell 400 taken along line 4B-4B.

The memory cell 440 includes a first electrode 420, a second electrode 440, and an insulating element 415 between an outer surface 422 of the first electrode 420 and the inner surface 441 of the second electrode 440.

The first electrode 420 extends from the top surface of the insulating element 415 to couple the phase change memory element 430 to underlying access circuitry (not shown). The first electrode 420 may comprise, for example, any of the materials discussed above with reference to the bottom electrode 220 of memory cell 200. The insulating element 415 may comprise, for example, silicon dioxide. Alternatively, the insulating element 415 may comprise other dielectric materials. Dielectric 410 surrounds the insulating element 415.

As can be seen in the top view of FIG. 4B, the inner surface 441 of the second electrode 440 surrounds the outer surface 422 of the first electrode 420. Also, in the illustrated embodiment the first electrode 420 and the insulating element 415 have circular cross-sections respectively, resulting in the respective outer surfaces 422 and 441 of the first electrode 420 and the second electrode 440 each having a circular cross-section. However, in embodiments the first electrode 420 and the insulating element 415 each respectively may have a cross-section that is circular, elliptical, square, rectangular, or somewhat irregularly shaped, depending upon the manufacturing technique used to form the first electrode 420 and the insulating element 415.

Referring back to FIG. 4A, the first electrode 420 has a top surface 424 substantially coplanar with a top surface 443 of the second electrode 440. As used herein the term "substantially coplanar" is intended to accommodate manufacturing tolerances during the formation of the electrodes 420, 440, as well as accommodate manufacturing processes performed following formation of the electrodes 420, 440 which may cause variations in the planarity of the top surfaces 424, 443.

Phase change memory element 430 extends across the insulating element 415 to contact the top surfaces 424 and 443 of the first and second electrodes 420, 440 respectively. The phase change memory element 430 may comprise, for example, any of the materials discussed above with reference to the phase change memory element 230 of the memory cell 200 of FIGS. 2A-2C.

The memory cell 400 also includes an insulating element 460 on the top surface of the phase change memory element 430. The insulating element 460 may comprise, for example, any of the materials discussed above with reference to the dielectric element 260 of the memory cell 200 of FIGS. 2A-2C.

An electrically conductive element 470 is on the insulating element 460. The material of the electrically conductive element 470 has an electrical conductivity greater than that of the electrically insulating element 460.

In the illustrated embodiment the material electrically conductive element 470 has a thermal conductivity less than that of the electrically insulating material of the insulating element 460. The electrically conductive element 470 may comprise, for example, any of the materials discussed above with reference to the electrically conductive element 270 of the memory cell 200 of FIGS. 2A-2C.

In the illustrated embodiment, the phase change memory element 430, the insulating element 460, and the electrically conductive element 470 form a stack having a sidewall surface 495. Dielectric 490, comprising for example silicon dioxide, is on the stack and contacts the sidewall surface 495 of the stack.

In operation, voltages on the first electrode 420 and the second electrode 440 will induce a current to flow from the first electrode 420 to the second electrode 440, or vice versa, through the phase change memory element 430.

As such, the coplanar top surfaces 424 and 443 of the first electrode 420 and the second electrode 440, and the insulating element 415 between them, cause the current to turn laterally and flow through the edge regions 454, which increases the current density and thus the amount of heat generated within the edge regions 454 of the active region 450 per unit value of current.

Thus, the electrodes 420, 440, the insulating element 415, and the electrically conductive element 470 provide means for redirecting current within a short distance of the contact surface 424 so that it flows laterally within the phase change memory element 415 relative to the direction of current flow at the contact surface 424, to increase current density within regions 454 of the phase change memory element over edges of the contact surface 424.

As a result the amount of current needed to induce phase change in the active region 450 is small. Additionally, increasing the current density and heat generated at the edges 454 reduces the heat sink effect of the first electrode 420.

The second electrode 440 comprises a plurality of layers of material which act to reduce the heat sink effect of the second electrode 440. The second electrode 440 may comprise, for example, a portion of a bit line.

The second electrode 440 comprises a layer 442 of first material 442 at the top surface 443, and a layer 444 of second material underlying the layer of first material 442. The first material of layer 442 has a thermal conductivity less than that of the second material of layer 444. The relatively low thermal conductivity of the first material acts to reduce the amount of heat drawn away from the phase change memory element 430 by the second electrode 440, effectively increasing the amount of heat generated within the phase change memory element 430 per unit value of current. As a result, the current needed to induce the desired phase change in the active region 450 can be very small.

In certain embodiments the second material of layer 444 also has an electrical conductivity greater than that of the first material of layer 442. The higher electrical conductivity of layer 444 helps to increase the electrical conductivity of the second electrode 440 and thus reduces the electrically loading of the second electrode 440.

In the illustrated embodiment the second electrode 440 further comprises a layer 446 of a third material, the second material of layer 444 having a thermal conductivity less than that of the third material of layer 446. In some embodiments layer 446 may be omitted. More generally, the second electrode 440 may comprise two or more layers of material.

In certain embodiments the first material of layer 442 comprises one of highly N-type doped TiN, TaN, and TaSiN, the second material of layer 444 comprises one of TiN and TaN, and the third material of layer 446 comprises one of Al, Cu, and W. Alternatively, other materials may be used.

FIGS. 5A-5E illustrate an embodiment of steps in a fabrication sequence for manufacturing a memory device 500 including the memory cell 400 of FIGS. 4A-4B.

Figure 5A:
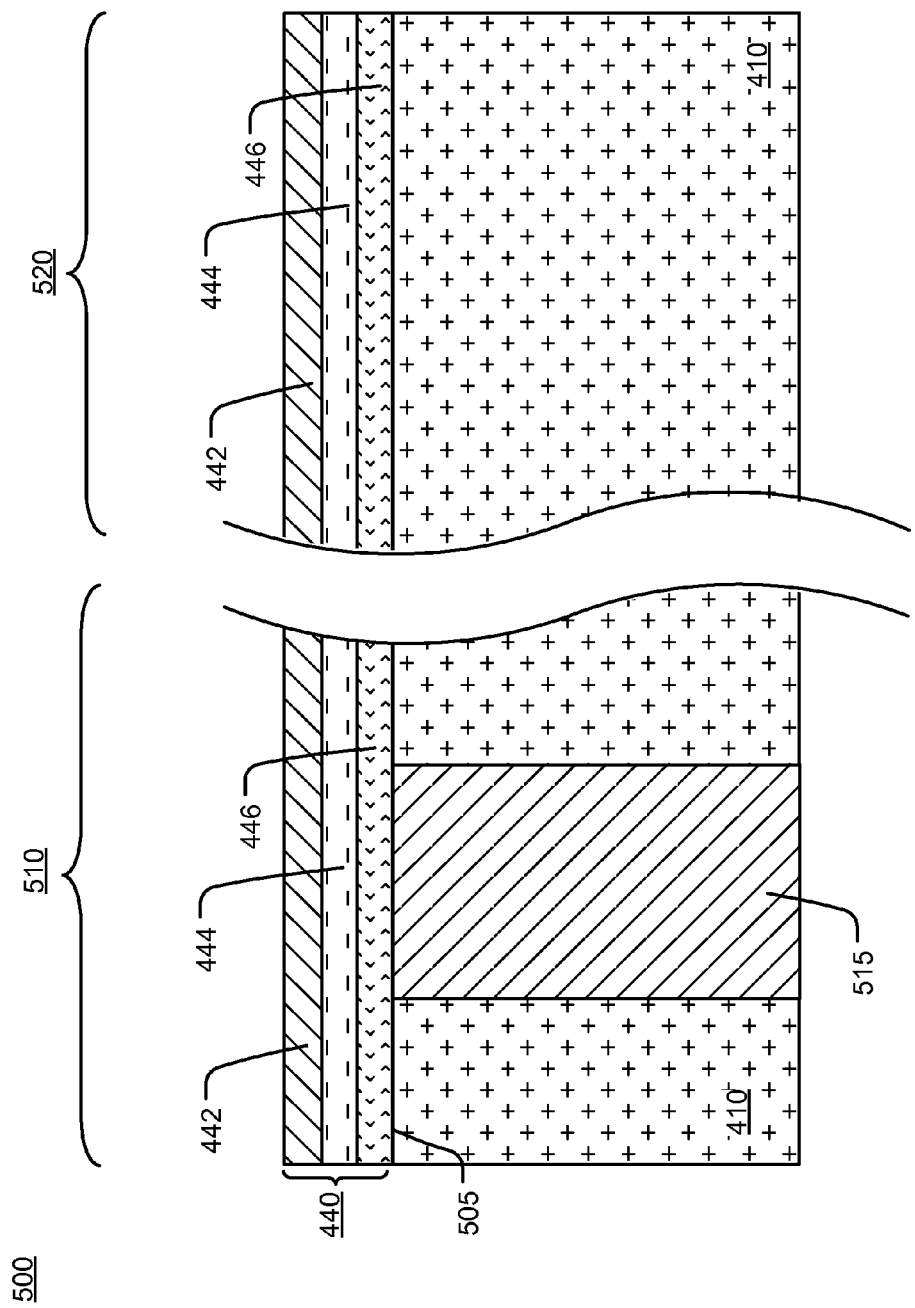
FIGS. 5A-5E illustrate an embodiment of steps in a fabrication sequence for manufacturing the memory device including the memory cell of FIGS. 4A-4B.

Referring to FIG. 5A, the memory device 500 includes a periphery region 510 and a memory region 520. The periphery region 510 includes a conductive contact 515 extending from the top surface 505 of dielectric 410 to an underlying logic device (not shown). The conductive contact 520 may comprise, for example, tungsten. Other materials may also be used for the conductive contact 520.

The memory region 510 includes access devices (not shown) underlying the dielectric 410. The configurations of the access devices in the memory region 510 and the logic devices in the periphery region 500 depend upon the configuration of the memory device 500 in which the memory cell 400 is to be implemented.

Material layer 446 is formed on the top surface 505 of the dielectric 410, material layer 444 is formed on the layer 446, and material layer 442 is formed on the layer 444. The layers 442, 444, and 446 are then patterned to form bit line 440 acting as the second electrode for the subsequently formed memory cell, resulting in the structure illustrated in FIG. 5A.

Figure 5B:
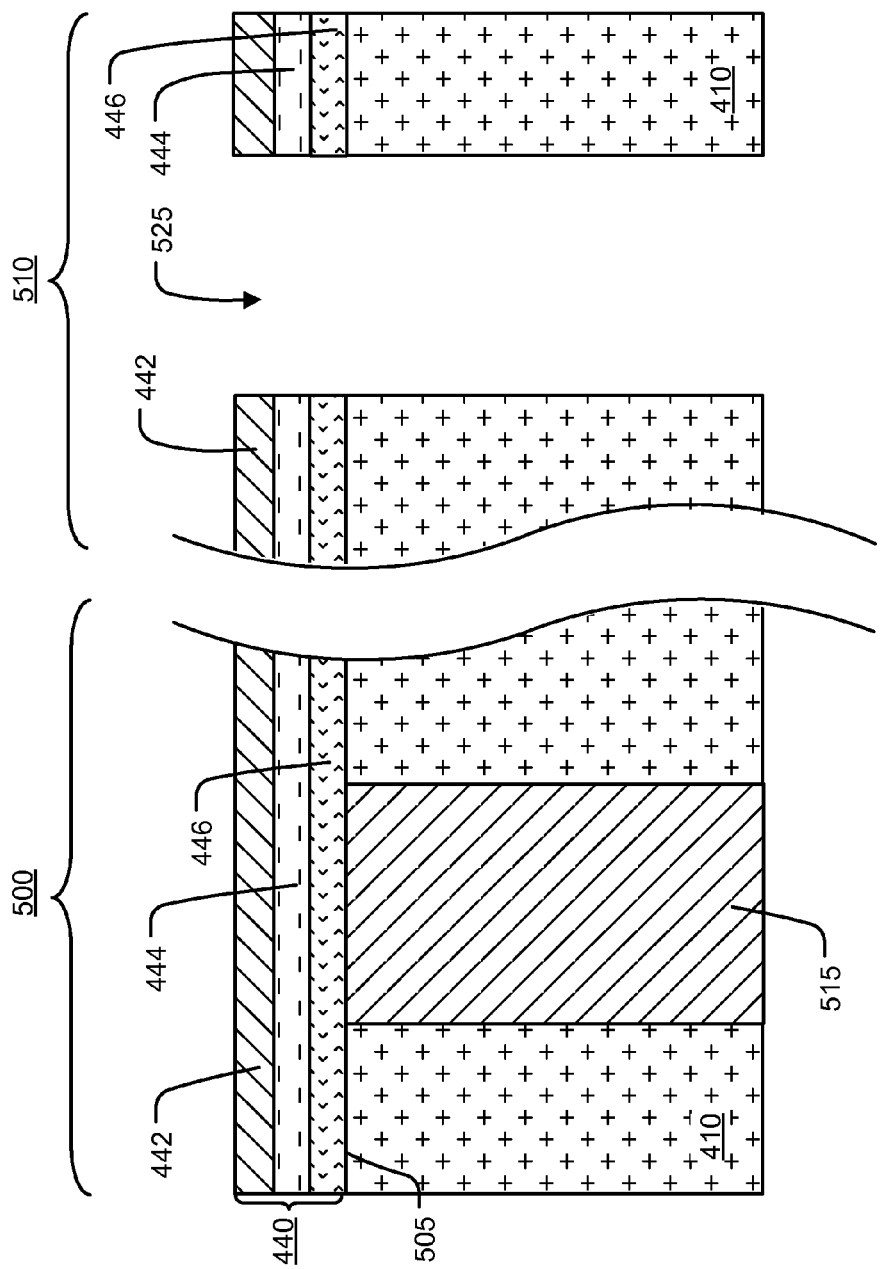

Next, opening 525 extending through the layers 442, 444, and 446 and dielectric 410 is formed in the memory region 510, resulting in the cross-sectional view of FIG. 5B. The opening 525 extends to the underlying access circuitry.

Figure 5C:
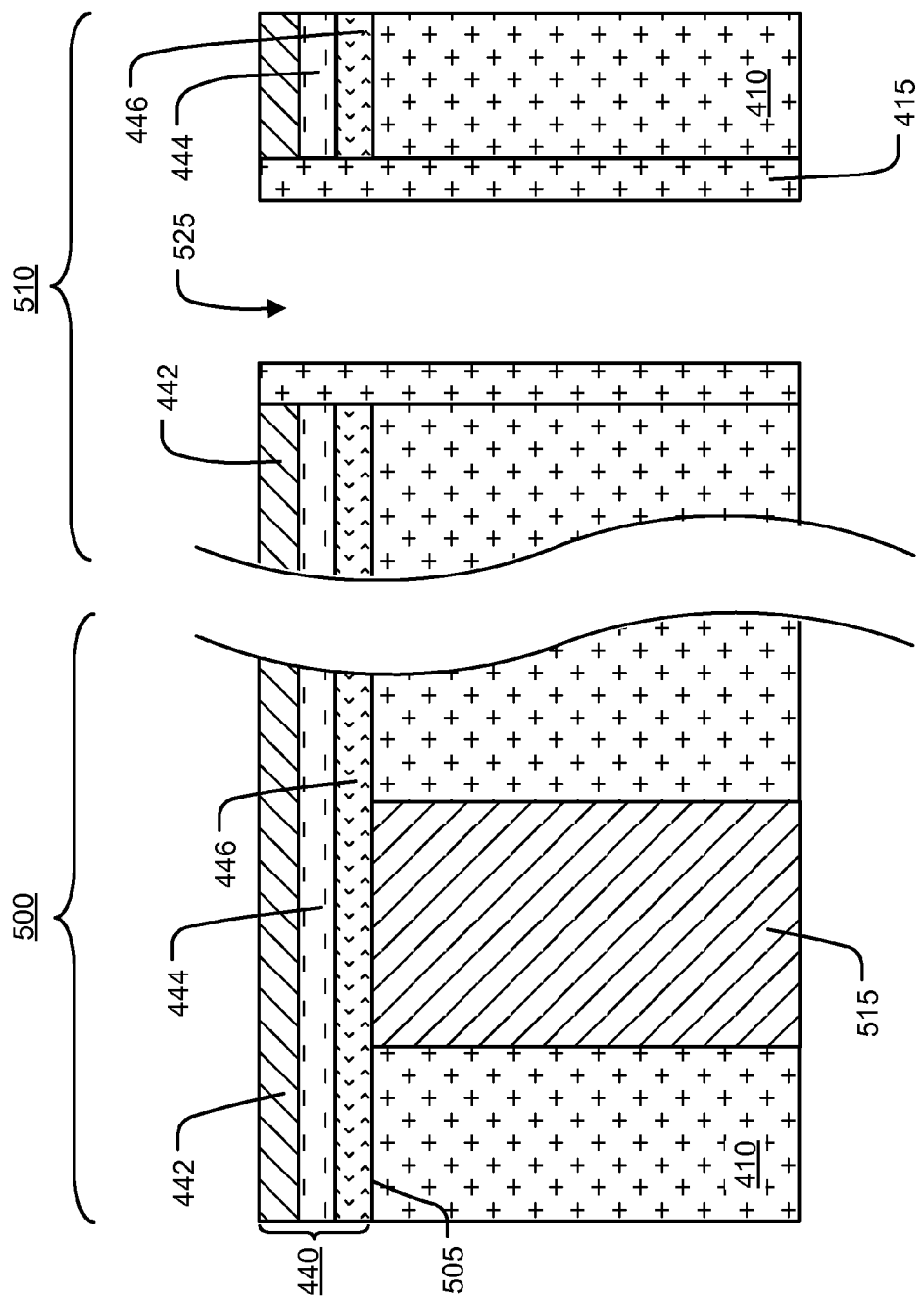

Next, dielectric material is deposited on the array region 510, including within the opening 525, and the dielectric material is anisotropically etched to form insulating element 415 within the opening 525, resulting in the structure illustrated in FIG. 5C.

Figure 5D:
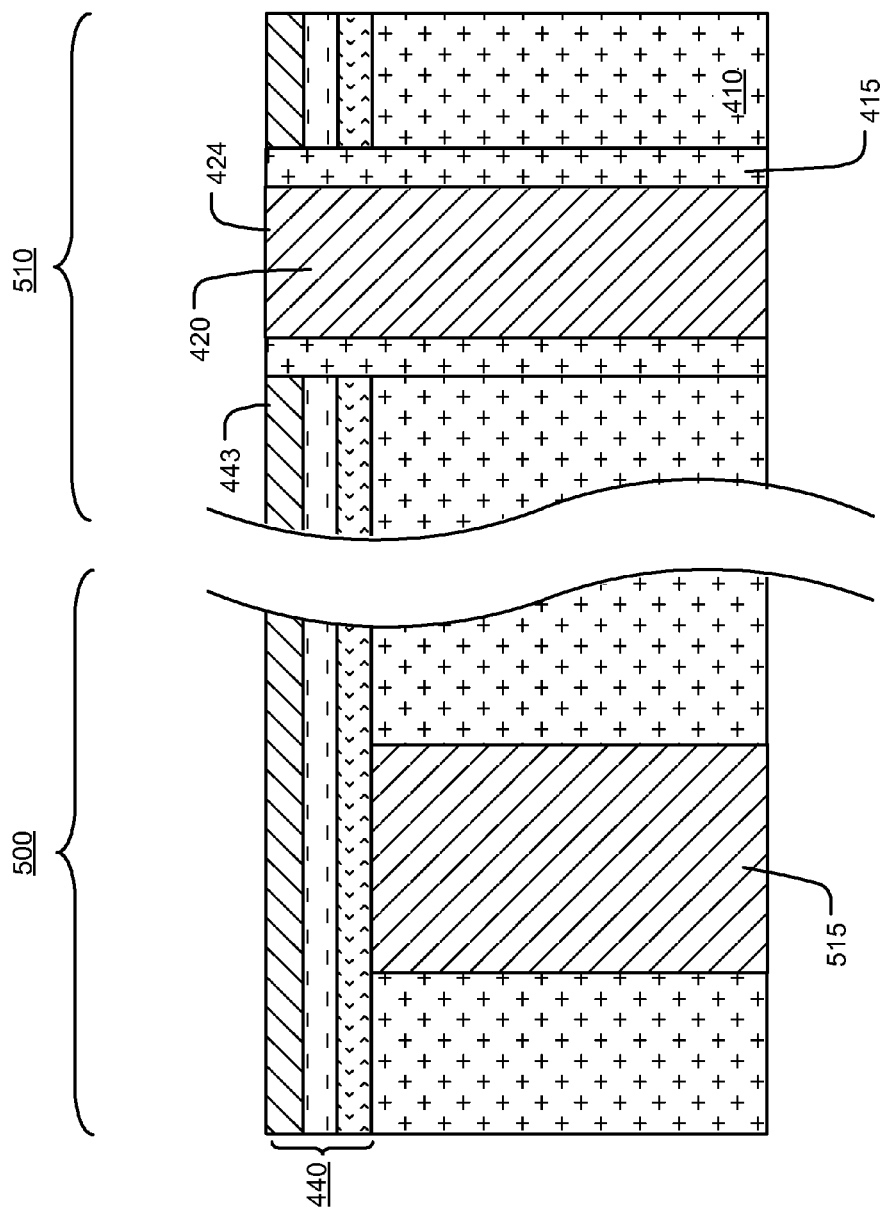

Next, first electrode material is formed on the memory region 510 including within the opening, and the first electrode material is planarized to form the first electrode 420 having a top surface 424 substantially coplanar with the top surface 443 of the bit line 440, resulting in the structure illustrated in FIG. 5D.

Next, phase change memory element material is formed on the memory region 510 of FIG. 5D, a first layer of dielectric is formed on the phase change memory element, electrically conductive element material is formed on the first layer of dielectric, and a second layer of dielectric is formed on the thermal isolation element material. The phase change memory element material, the first layer of dielectric, the electrically conductive element, and the second layer of dielectric are then patterned, resulting in the structure illustrated in the cross-sectional view of FIG. 5E.

Figure 5E:
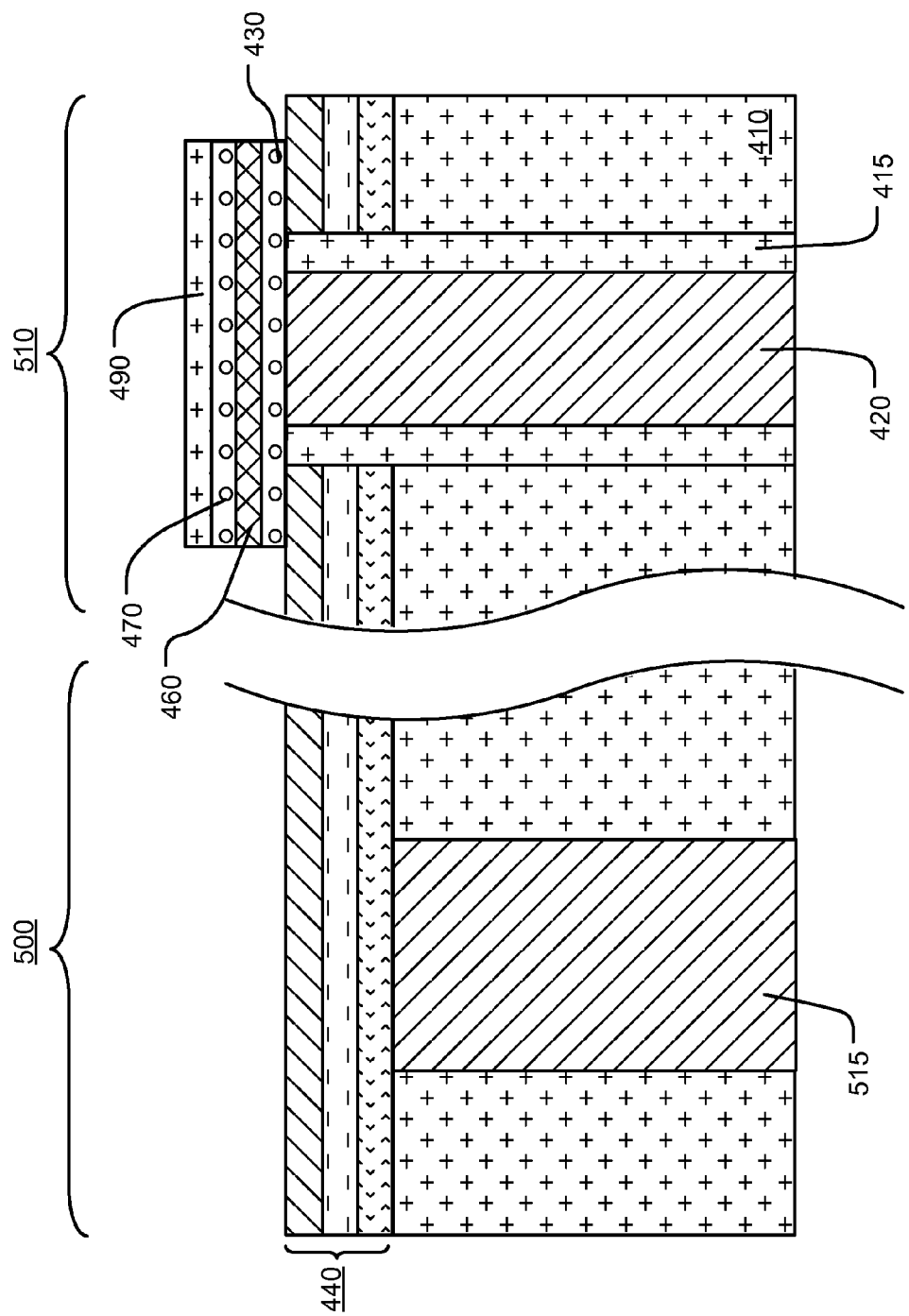

As can be seen in FIG. 5E, the multi-layer bit line 440 acting as the second electrode for memory cells in the memory region 510 is formed concurrently in the periphery region 500. As a result, the memory device has reduced complexity and addresses design integration issues of periphery and memory regions, thereby reducing cost.

Figure 6:
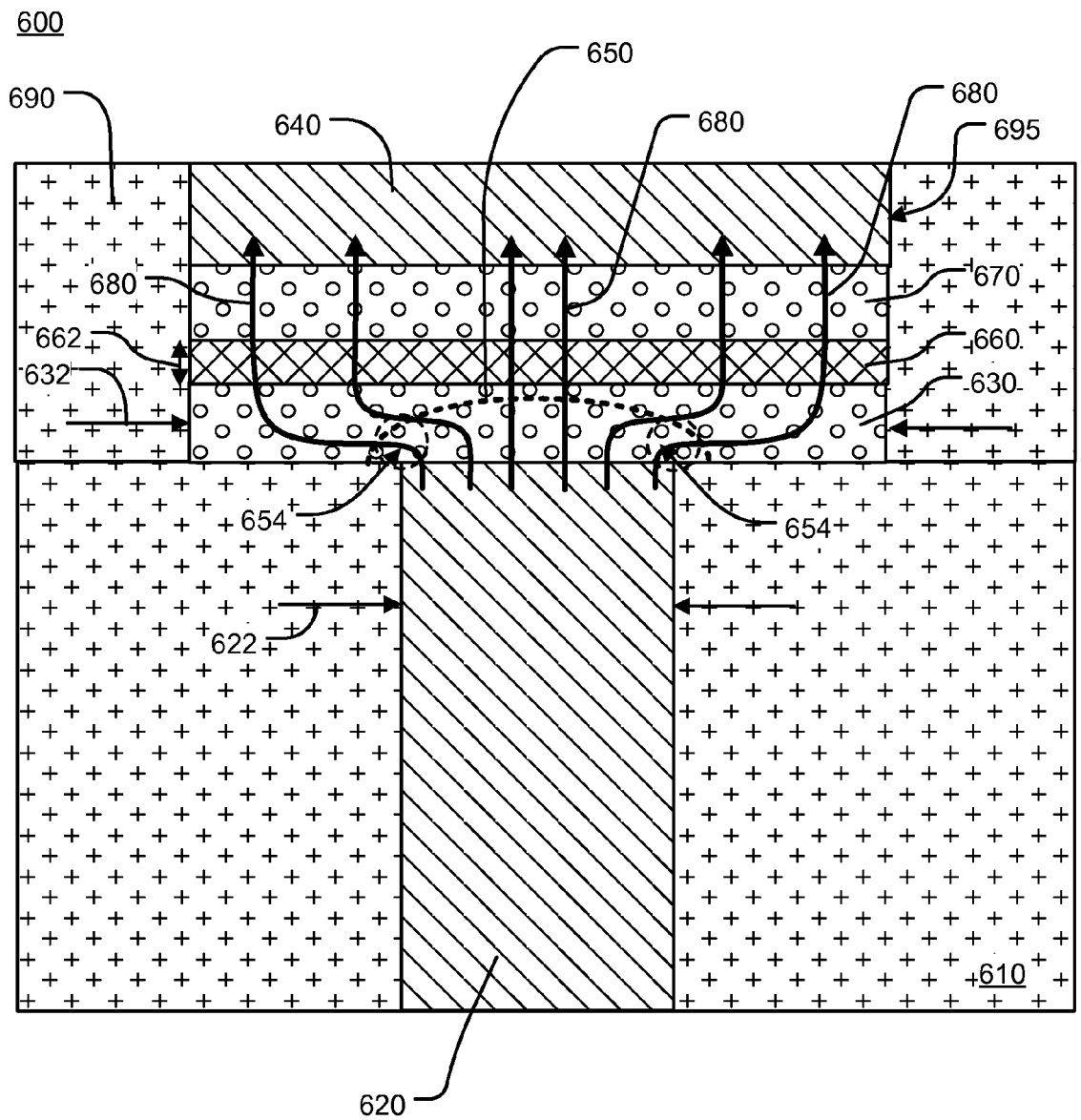
FIG. 6 illustrates a cross-sectional view of a third embodiment of a memory cell having increased current density at edges of an active region.

FIG. 6 is a cross-sectional view of a third embodiment of a memory cell 600 having increased current density at edges of an active region compared to that of the memory cell 100 of FIG. 1, resulting in improved operational current efficiency and reliability.

The memory cell 600 includes a bottom electrode 620 contacting the bottom surface of a phase change memory element 630 and extending from the top surface of dielectric 610 to couple the phase change memory element 630 to underlying access circuitry (not shown). The bottom electrode 620 may comprise, for example, any of the materials discussed above with reference to the bottom electrode 220 of memory cell 200. The dielectric 610 may comprise, for example, silicon dioxide. Alternatively, the dielectric 610 may comprise other dielectric materials.

The phase change memory element 630 may comprise, for example, any of the materials discussed above with reference to the phase change memory element 230 of the memory cell 200 of FIGS. 2A-2C. The phase change memory element 630 has a width 632 greater than the width 622 of the bottom electrode 620.

A tunneling dielectric element 660 is on the top surface of the phase change memory element 630. As discussed in more detail below, the tunneling dielectric element 660 comprises dielectric material having a thickness 662 sufficient to allow charge to tunnel along inter-electrode path 680 through the tunneling dielectric element 660 by an electric field induced by voltages applied to the top electrode and 640 bottom electrode 620.

The thickness 662 of the tunneling dielectric element 660 sufficient to allow tunneling of charge is dependent upon the material of the tunneling dielectric element 660, as well as the operating voltages applied to the top and bottom electrodes 640, 620 during operation of the memory cell 200. The thickness 662 can be determined empirically for each embodiment. In certain embodiments the tunneling dielectric element 660 comprises one of silicon dioxide, silicon nitride, aluminum oxide, and ruthenium oxide. In certain embodiments the thickness 662 is less than 30 Angstroms, for example being about 10 Angstroms.

An electrically conductive element 670 is on the tunneling dielectric element 660. The material of the electrically conductive element 670 has an electrical conductivity greater than that of the tunneling dielectric element 660.

In the illustrated embodiment, the electrically conductive element 670 comprises material having a thermal conductivity less than that of the tunneling dielectric element 660. The electrically conductive element 670 may comprise, for example, any of the materials discussed above with reference to the electrically conductive element 270 of the memory cell 200 of FIGS. 2A-2C. In the illustrated embodiment the electrically conductive element 670 comprises the same phase change material as that of the phase change memory element 630. Alternatively, other materials may be used.

The electrically conductive element 670 acts as a heat insulator to reduce the amount of heat drawn away from the phase change memory element 630 by the overlying top electrode 640. In some embodiments the electrically conductive element 670 is omitted.

The top electrode 640 may comprise for example, any of the materials discussed above with reference to the electrode 240 of the memory cell 200 of FIGS. 2A-2C.

In the illustrated embodiment, the phase change memory element 630, the tunneling dielectric element 660, the electrically conductive element 670, and the top electrode 640 form a stack having a sidewall surface 695. Dielectric 690, comprising for example silicon dioxide, surrounds the stack and contacts the sidewall surface 695 of the stack.

In operation, voltages on the bottom electrode 620 and the top electrode 640 induce a current to flow along path 680 from the bottom electrode 620 to the top electrode 640, or vice versa, through the phase change memory element 630, tunneling dielectric element 660, and electrically conductive element 670.

The relatively high electrical conductivity of the phase change material of the phase change memory element 630 beneficially affects the uniformity of the electric field across the tunneling dielectric element 660 to cause some of the current in the phase change memory element 680 to turn laterally and flow through the edge regions 654 of the active region 650 of the phase change memory element 630.

The increased current density at the edge regions 654 of the active region 650 thus increases the amount of heat generated within the edge regions 654 per unit value of current. As a result, the amount of current needed to induce phase change in the active region 650 is small. Additionally, increasing the current density and heat generated at the edges 654 reduces the heat sink effect of the bottom electrode 620.

Thus, the electrodes 620, 640, the tunneling dielectric element 660, and the electrically conductive element 670 provide means for redirecting current within a short distance of the top surface of the bottom electrode 620 so that it flows laterally within the phase change memory element 630 relative to the direction of current flow at the top surface of the bottom electrode 620, to increase current density within regions 654 of the phase change memory element 630 over edges of the top surface of the bottom electrode 620.

Figure 7A:
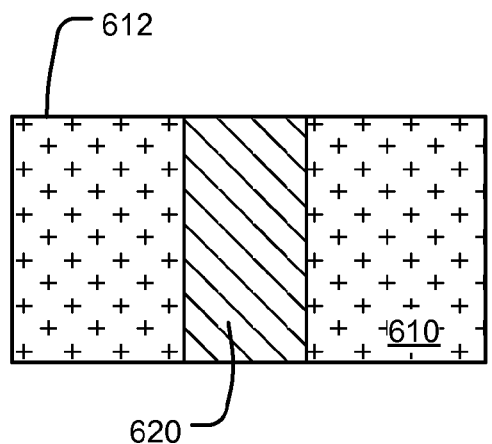
FIGS. 7A-7C illustrate an embodiment of steps in a fabrication sequence for manufacturing the memory cell of FIG. 6.
Figure 7B:
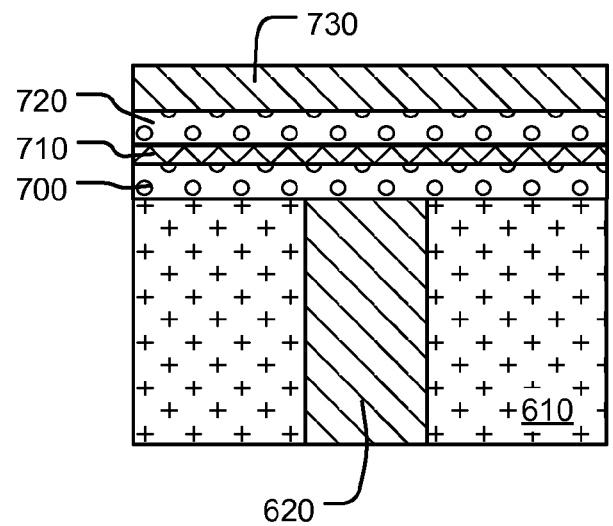
Figure 7C:
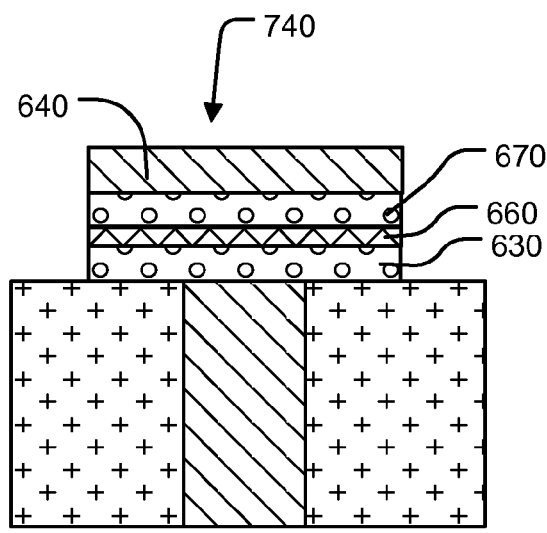

FIGS. 7A-7C illustrate an embodiment of steps in a fabrication sequence for manufacturing the memory cell of FIG. 6. Bottom electrode 620 is formed extending to the top surface 612 of dielectric 610, resulting in the structure shown in the cross-sectional view of FIG. 7A.

The bottom electrode 620 and dielectric 610 can be formed, for example, as discussed above with reference to FIG. 3A.

Next, a phase change memory element material 700 is formed on the structure illustrated in FIG. 7A, tunneling dielectric element material 710 is formed on the phase change memory element material 700, electrically conductive element material 720 is formed on the tunneling dielectric element material 710, and top electrode material 730 is formed on the thermal isolation element material 720, resulting in the structure illustrated in the cross-sectional view of FIG. 7B.

The materials 700, 710, 720, and 730 are then patterned to form stack 740, resulting in the structure illustrated in the cross-sectional view of FIG. 7C. The stack 740 includes phase change memory element 630, tunneling dielectric element 660, electrically conductive element 670, and top electrode 640. Next, dielectric 690 is formed on the structure illustrated in FIG. 7C and planarized, resulting in the memory cell 600 of FIG. 6.

Figure 8:
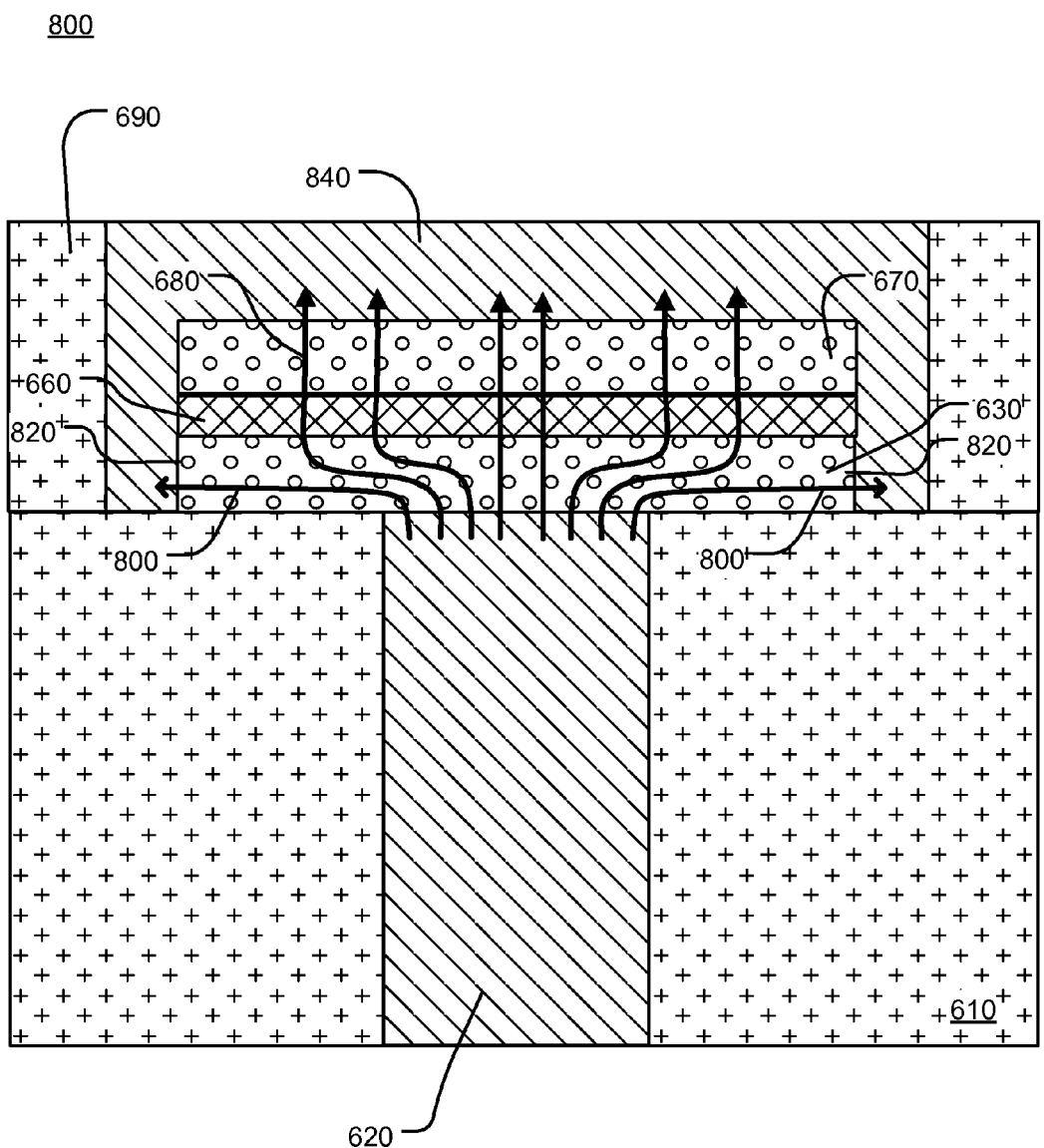
FIG. 8 illustrates a cross-sectional view of a fourth embodiment of a memory cell having increased current density at edges of an active region.

FIG. 8 is a cross-sectional view of a fourth embodiment of a memory cell 800 having increased current density at edges of an active region compared to that of the memory cell 100 of FIG. 1, resulting in improved operational current efficiency and reliability. The memory cell 800 is similar to the memory cell 600 of FIG. 6, and includes top electrode 840 contacting the side surface 820 of the phase change memory element 630 to define a second inter-electrode current path 800 between the top electrode 640 and the bottom electrode 620 through the side surface 820 of the phase change memory element 630. The additional current path 800 is useful for providing adequate current through the memory cell 800 during read operations.

Figure 9A:
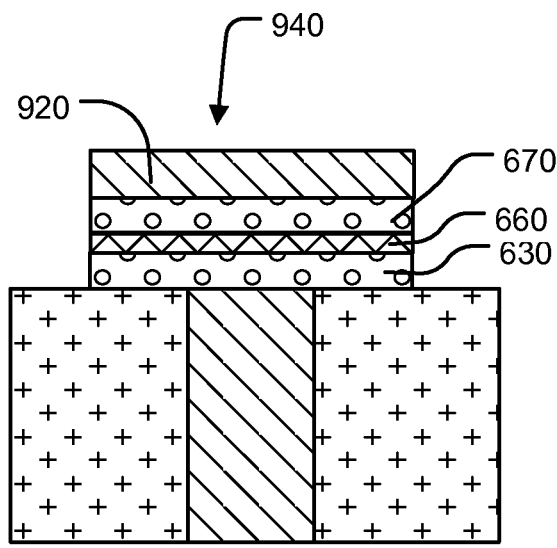
FIGS. 9A-9B illustrate an alternative embodiment to the step of FIG. 7C, resulting in the formation of the memory cell of FIG. 8.
Figure 9B:
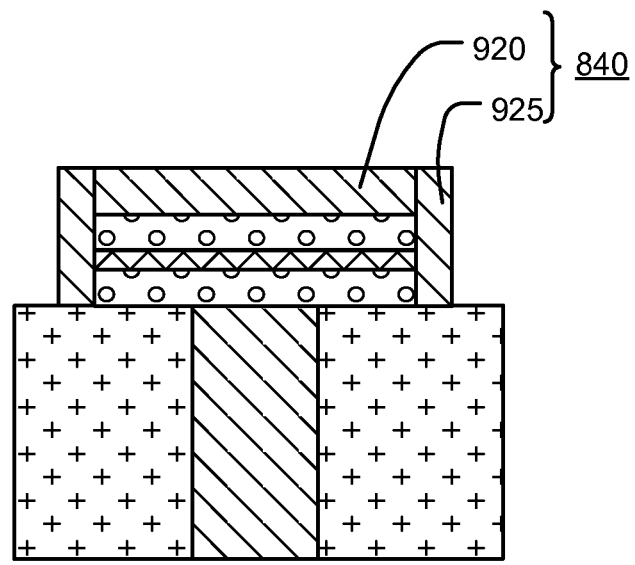

FIGS. 9A-9B illustrate an alternative embodiment to the step of FIG. 7C, resulting in the formation manufacturing the memory cell of FIG. 8.

Referring to FIG. 7B, the materials 700, 710, 720, and 730 are then patterned to form stack 940, resulting in the structure illustrated in the cross-sectional view of FIG. 9A. The stack 940 includes phase change memory element 630, tunneling dielectric element 660, electrically conductive element 670, and upper portion 920 of the top electrode 840.

Next, a conductive layer is formed on the structure illustrated in FIG. 9A including on the sidewall surface of the stack 940, and the conductive layer is anisotropically etched to form sidewall portions 925 of the top electrode 840, resulting in the structure illustrated in the cross-sectional view of FIG. 9B. Next, dielectric 690 is formed on the structure illustrated in FIG. 9B and planarized, resulting in the memory cell 800 of FIG. 8.

Figure 10:
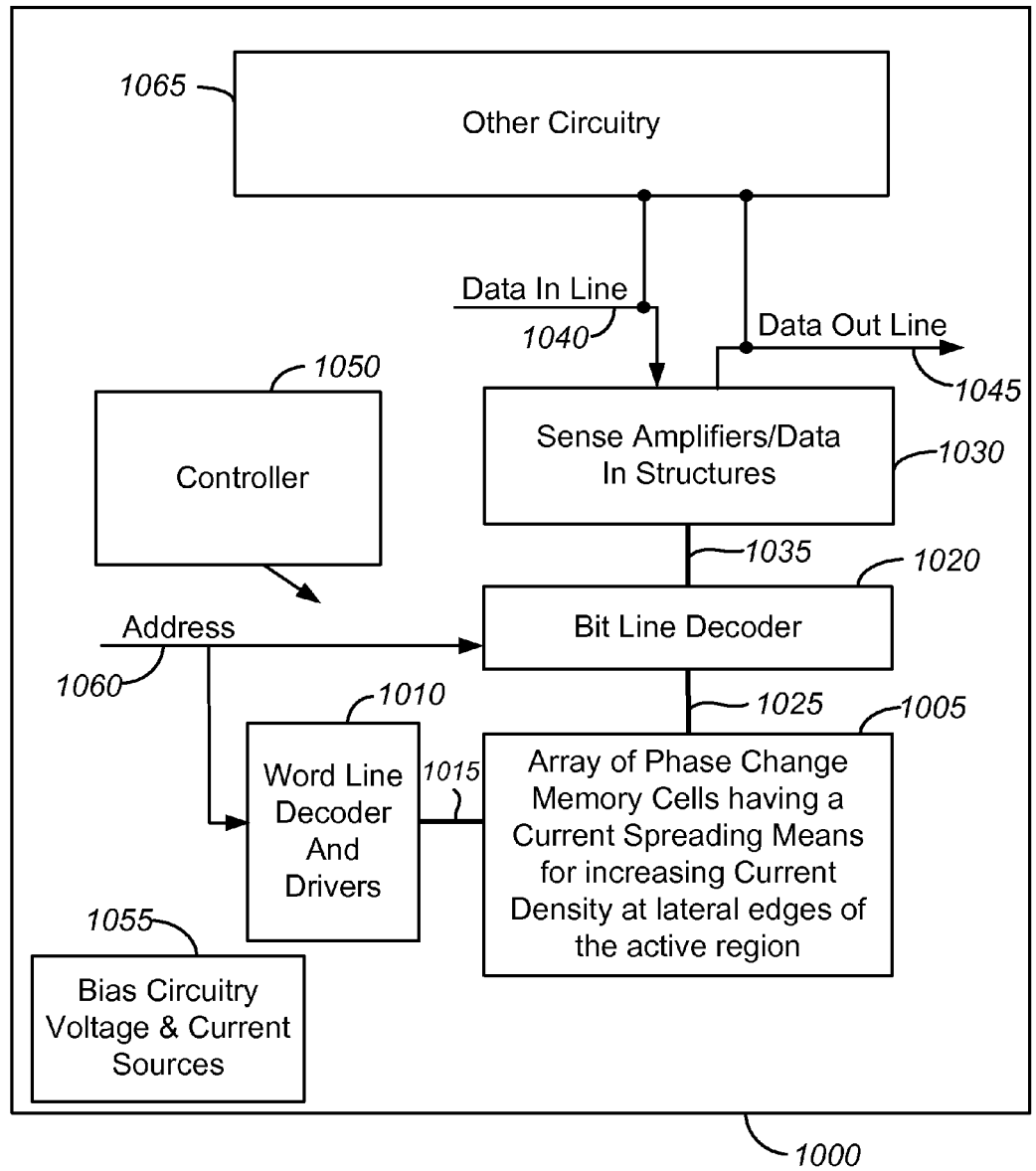
FIG. 10 is a simplified block diagram of an integrated circuit in which the memory cells described herein can be implemented.

FIG. 10 is a simplified block diagram of an integrated circuit 1000 including a memory array 1005 having memory cells having current spreading means for increasing current density at lateral edges of the active region of phase change memory elements as described herein, the phase change memory elements programmable to a plurality of resistance states including a lower resistance state and a higher resistance state. A word line decoder 1010 having read, reset, reset verify, set verify, and set modes is coupled to and in electrical communication with a plurality of word lines 1015 arranged along rows in the memory array 1005. A bit line (column) decoder 1020 is in electrical communication with a plurality of bit lines 1025 arranged along columns in the array 1005 for reading and programming the memory cells (not shown) in array 1005.

Addresses are supplied on bus 1060 to word line decoder and drivers 1010 and bit line decoder 1020. Sense circuitry (Sense amplifiers) and data-in structures in block 1030, including voltage and/or current sources for the read and program modes are coupled to bit line decoder 1020 via data bus 1035. Data is supplied via a data-in line 1040 from input/output ports on integrated circuit 1000, or from other data sources internal or external to integrated circuit 1000, to data-in structures in block 1030. Other circuitry 1065 may be included on integrated circuit 1000, such as a general purpose processor or special purpose application circuitry, or a combination of modules providing system-on-a-chip functionality supported by array 1005. Data is supplied via a data-out line 1045 from the sense amplifiers in block 1330 to input/output ports on integrated circuit 1000, or to other data destinations internal or external to integrated circuit 1000.

The integrated circuit 1010 includes a controller 1050 for read, reset, reset verify, set verify, and set modes of the memory cells of the array 1005. The controller 1050, implemented in this example using a bias arrangement state machine, controls the application of bias circuitry voltage & current sources 1055 for the application of bias arrangements including read, set and reset to the word lines 1015, bit lines 1025, and in some embodiments source lines. Controller 1050 may be implemented using special-purpose logic circuitry as known in the art. In alternative embodiments, controller 1050 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 1050.

Figure 11:
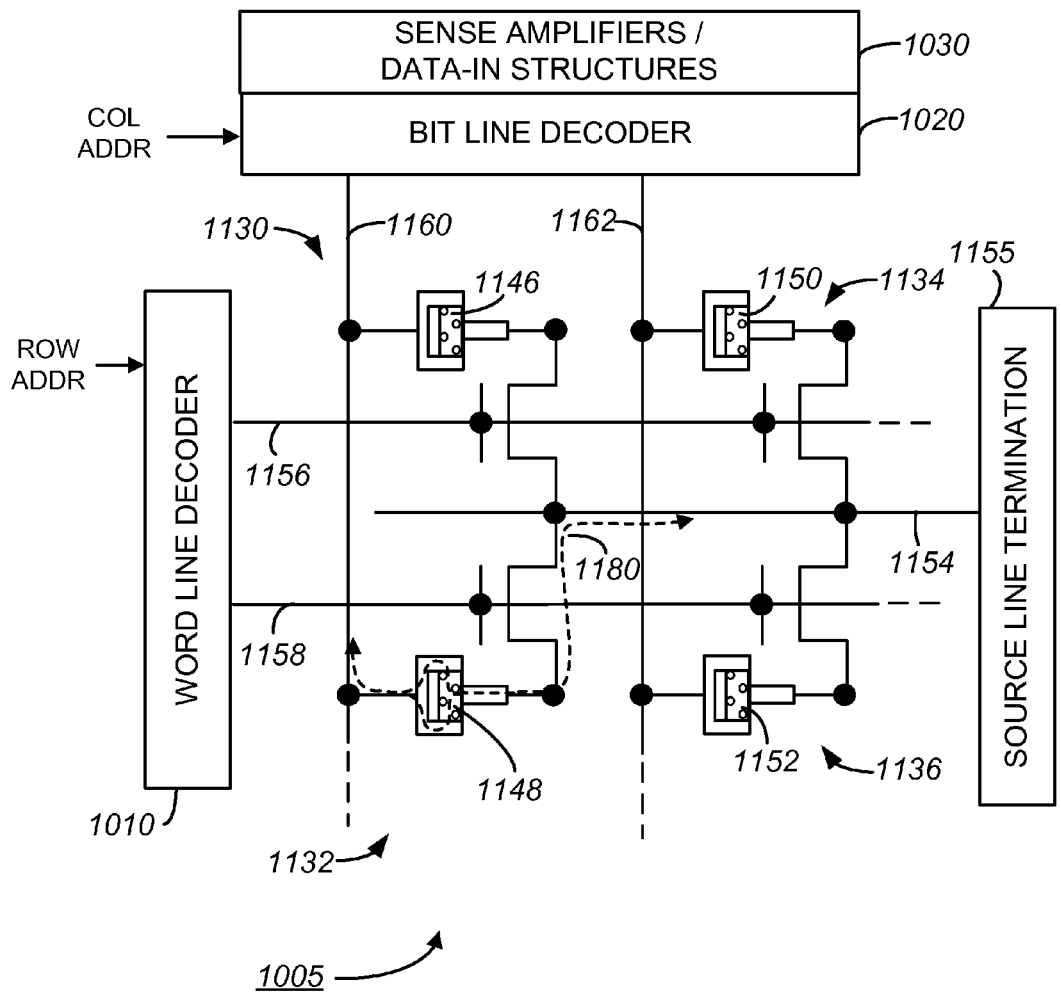
FIG. 11 is a schematic diagram of a portion of an embodiment of the memory array of the integrated circuit of FIG. 10.

As shown in FIG. 11, each of the memory cells of array 1005 includes an access transistor (or other access device such as a diode) and a phase change memory element. In FIG. 14 four memory cells 1130, 1132, 1134, 1136 having respective memory elements 1140, 1142, 1144, 1146 are illustrated, representing a small section of an array that can include millions of memory cells. The memory elements are programmable to a plurality of resistance states including a lower and a higher resistance state.

Sources of each of the access transistors of memory cells 1130, 1132, 1134, 1136 are connected in common to source line 1154 that terminates in source line termination circuit 1155, such as a ground terminal. In another embodiment the source lines of the access devices are not electrically connected, but independently controllable. The source line termination circuit 1155 may include bias circuitry such as voltage sources and current sources, and decoding circuits for applying bias arrangements, other than ground, to the source line 1154 in some embodiments.

A plurality of word lines including word lines 1156, 1158 extend in parallel along a first direction. Word lines 1156, 1158 are in electrical communication with word line decoder 1010. The gates of access transistors of memory cells 1130 and 1134 are connected to word line 1156, and the gates of access transistors of memory cells 1132 and 1136 are connected in common to word line 1158.

A plurality of bit lines including bit lines 1160, 1162 extend in parallel in a second direction and are in electrical communication with bit line decoder 1120. In the illustrated embodiment each of the memory elements are arranged between the drain of the corresponding access device and the corresponding bit line. Alternatively, the memory elements may be on the source side of the corresponding access device.

It will be understood that the memory array 1105 is not limited to the array configuration illustrated in FIG. 11, and additional array configurations can also be used. Additionally, instead of MOS transistors, bipolar transistors or diodes may be used as access devices in some embodiments.

In operation each of the memory cells in the array 1105 store data depending upon the resistance of the corresponding memory element. The data value may be determined, for example, by comparison of current on a bit line for a selected memory cell to that of a suitable reference current by sense amplifiers of sense circuitry 1030. The reference current can be established to that a predetermined range of currents correspond to a logical "0", and a differing range of currents correspond to a logical "1". In a memory cell having three or more states, reference currents can be established so that differing ranges of bit line currents correspond to each of the three or more states.

Reading, or writing to a memory cell of array 1105 can be achieved by applying a suitable voltage to one of word lines 1156, 1158 and coupling one of bit lines 1160, 1162 to a voltage so that current flows through the selected memory cell. For example, a current path 1180 through a selected memory cell (in this example memory cell 1132 and corresponding memory element 1148) is established by applying voltages to the bit line 1160, word line 1158, and source line 1154 sufficient to turn on the access transistor of memory cell 1132 and induce current in path 1180 to flow from the bit line 1160 to the source line 1154, or vice-versa. The level and duration of the voltages applied is dependent upon the operation performed.

In a reset (or erase) operation of memory cell 1132, word line decoder 1010 facilitates providing word line 1058 with a suitable voltage to turn on the access transistor of the memory cell 1132. Bit line decoder 1120 facilitates supplying one or more voltage pulses to bit line 1160 of suitable amplitude and duration to induce a current to flow though memory element 1148, thereby raising the temperature of at least the active region above the transition temperature of the phase change material of the memory element 1148 and also above the melting temperature to place at least the active region in a liquid state. The current is then terminated, for example by terminating the voltage pulse on the bit line 1160 and the voltage on the word line 1158, resulting in a relatively quick quenching time as the active region rapidly cools to stabilize to an amorphous phase.

In a read (or sense) operation of memory cell 1132, word line decoder 1010 facilitates providing word line 1158 with a suitable voltage to turn on the access transistor of the memory cell 1132. Bit line decoder 1120 facilitates supplying a voltage to bit line 1160 of suitable amplitude and duration to induce current to flow that does not result in the memory element 1148 undergoing a change in resistive state. The current on the bit line 1160 and through the memory element 1148 is dependent upon the resistance of, and therefore the data state associated with, the memory element 1148 of the memory cell 1132. Thus, the data state of the memory cell 1132 may be determined, for example by comparison of the current on bit line 1160 with a suitable reference current by sense amplifiers of sense circuitry 1130.

In a set (or program) operation of memory cell 1132, word line decoder 1010 facilitates providing word line 1158 with a suitable voltage to turn on the access transistor of the memory cell 1132. Bit line decoder 1120 facilitates supplying a voltage to bit line 1160 of suitable amplitude and duration to induce current to flow through the memory element 1148, thereby raising the temperature of a least a portion of the active region above the transition temperature of the phase change material to cause a transition of at least a portion of the active region from the amorphous phase to the crystalline phase, this transition lowering the resistance of the memory element 1148 and setting the memory cell 1132 to the desired state.

Embodiments of the memory cells described herein include phase change based memory materials, including chalcogenide based materials and other materials, for the memory elements. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky U.S. Pat. No. 5,687,112 patent, cols. 10-11.) Particular alloys evaluated by another researcher include Ge2Sb2Te5, GeSb2Te4 and GeSb4Te7 (Noboru Yamada, "Potential of Ge—Sb—Te Phase-Change Optical Disks for High-Data-Rate Recording", SPIE v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistance properties. Specific examples of memory materials that may be useful are given in Ovshinsky '112 at columns 11-13, which examples are hereby incorporated by reference.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g., U.S. Pat. No. 6,800,504, and U.S. Patent Application Publication No. U.S. 2005/0029502.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

An exemplary method for forming chalcogenide material uses chemical vapor deposition CVD such as that disclosed in US Publication No 2006/0172067 entitled "Chemical Vapor Deposition of Chalcogenide Materials", which is incorporated by reference herein.

A post-deposition annealing treatment in a vacuum or in an N2 ambient is optionally performed to improve the crystallized state of chalcogenide material. The annealing temperature typically ranges from 100° C. to 400° C. with an anneal time of less than 30 minutes.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device comprising:
   a phase change memory element having a top surface, a bottom surface, a side surface, and a thickness between the top and bottom surfaces;
   an electrically insulating element covering and contacting the entire top surface of the phase change memory element, blocking a current flow through the top surface;
   a thermal isolation element on the electrically insulating element, the thermal isolation element comprising material having a thermal conductivity less than that of material of the electrically insulating element;
   a bottom electrode contacting the bottom surface of the phase change memory element at a first contact surface, the first contact surface when projected above the bottom electrode defining a cylinder having sides extending the thickness of the phase change memory element, said sides of the cylinder having a surface area less than or equal to twice that of the first contact surface; and
   a side electrode contacting only the side surface of the phase change memory element at a second contact surface.

2. The memory device of claim 1, wherein the sides of the cylinder have a surface area less than or equal to that of the first contact surface.

3. The memory device of claim 1, wherein the bottom electrode has a diameter at the first contact surface, the diameter greater than or equal to twice the thickness of the phase change memory element.

4. The memory device of claim 3, wherein the diameter of the bottom electrode is greater than or equal to the thickness of the phase change memory element.

5. The memory device of claim 3, wherein:
   the diameter of the bottom electrode is less than or equal to 130 nm, and
   the thickness of the phase change memory element is less than or equal to 100 nm.

6. The memory device of claim 1, wherein the side electrode surrounds the outer surface of the phase change memory element.

7. The memory device of claim 6, wherein the phase change memory element, the electrically insulating element, and the thermal isolation element form a stack having a sidewall surface, the side electrode on the stack and contacting the sidewall surface of the stack.

8. The memory device of claim 1, wherein:
the phase change memory element comprises a first phase change material; and
the thermal isolation element comprises a second phase change material.

9. A memory device comprising:
a first electrode having a top surface and an outer surface;
a second electrode having a top surface substantially coplanar with the top surface of the first electrode, and having an inner surface surrounding the outer surface of the first electrode, the second electrode comprising a first material at the top surface and a second material underlying the first material, the first material having a thermal conductivity less than that of the second material;
an insulating element between the outer surface of the first electrode and the inner surface of the second electrode; and
a phase change memory element extending across the insulating element to contact the top surfaces of the first electrode and the second electrode.

10. The memory device of claim 9, wherein the first material further has an electrical conductivity less than that of the second material.

11. The memory device of claim 9, wherein the second electrode further comprises a third material underlying the second material, the second material having a thermal conductivity less than that of the third material.

12. The memory device of claim 9, further comprising:
a second insulating element on the phase change memory element; and
a thermal isolation element on the second insulating element, the thermal isolation element comprising material having a thermal conductivity less than that of material of the second insulating element.

13. The memory device of claim 12 wherein:
the phase change memory element comprises a first phase change material; and
the thermal isolation element comprises a second phase change material.

* * * * *